(12) United States Patent
Scheuerlein et al.

(10) Patent No.: US 7,940,554 B2
(45) Date of Patent: May 10, 2011

(54) REDUCED COMPLEXITY ARRAY LINE DRIVERS FOR 3D MATRIX ARRAYS

(75) Inventors: Roy E. Scheuerlein, Cupertino, CA (US); Luca Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 145 days.

(21) Appl. No.: 12/385,964

(22) Filed: Apr. 24, 2009

(65) Prior Publication Data

US 2010/0271885 A1 Oct. 28, 2010

(51) Int. Cl.
*G11C 11/00* (2006.01)

(52) U.S. Cl. ............ 365/163; 365/189.09; 365/230.06

(58) Field of Classification Search .......... 365/174–175, 365/148, 163, 230.04, 230.06, 189.09, 226
See application file for complete search history.

(56) References Cited

U.S. PATENT DOCUMENTS

| | | | |
|---|---|---|---|
| 4,646,266 A | | 2/1987 | Ovshinsky et al. |
| 5,014,241 A | | 5/1991 | Asakura et al. |
| 5,392,242 A | * | 2/1995 | Koike ............... 365/189.18 |
| 5,625,590 A | * | 4/1997 | Choi et al. ......... 365/185.17 |
| 5,751,012 A | | 5/1998 | Wolstenholme et al. |
| 5,835,396 A | | 11/1998 | Zhang |
| 5,841,687 A | | 11/1998 | Rees |
| 6,034,882 A | | 3/2000 | Johnson et al. |
| 6,055,180 A | | 4/2000 | Gudesen et al. |
| 6,185,122 B1 | | 2/2001 | Johnson et al. |
| 6,420,215 B1 | | 7/2002 | Knall et al. |
| 6,507,531 B1 | * | 1/2003 | Zhang ............... 365/230.02 |
| 6,618,295 B2 | | 9/2003 | Scheuerlein |
| 6,631,085 B2 | | 10/2003 | Kleveland et al. |
| 6,788,600 B2 | * | 9/2004 | Sugawara et al. ....... 365/207 |
| 7,081,377 B2 | | 7/2006 | Cleeves |
| 7,463,536 B2 | * | 12/2008 | Scheuerlein et al. ... 365/189.18 |
| 2002/0163033 A1 | | 11/2002 | Sugawara et al. |
| 2005/0269553 A1 | | 12/2005 | Sen et al. |
| 2007/0114509 A1 | | 5/2007 | Herner |
| 2008/0025085 A1 | | 1/2008 | Scheuerlein et al. |

OTHER PUBLICATIONS

International Search Report and Written Opinion, International Application PCT/US2010/031876, International Searching Authority: European Patent Office (ISR/EP), Jul. 22, 2010.

Peter K. Naji et al. "A 256 kb 3.0V iTiMTJ Nonvolatile Magnetoresistive RAM." Digest of Technical Papers of the 2001 IEEE International Solid-State Circuits COnference, ISSCC 2001 Session 7 Technology Directtions: Advanced Technologies 7.6, Feb 6, 2001, pp. 94-95, 404-405 of ISSCC Visual Supplement.

* cited by examiner

*Primary Examiner* — Gene N. Auduong
(74) *Attorney, Agent, or Firm* — The Marbury Law Group, PLLC

(57) ABSTRACT

A method of biasing a nonvolatile memory array. The nonvolatile memory array includes a first and second plurality of Y lines, a plurality of X lines, a first and second plurality of two terminal memory cells. Each first and second memory cell is coupled to one of the first or second plurality of Y lines and one of the plurality of X lines, respectively. Substantially all of the first plurality and second plurality of Y lines are driven to a Y line unselect voltage. At least one selected Y line of the first plurality of Y lines is driven to a Y line select voltage while floating remaining Y lines of the first plurality of Y lines and while driving substantially all of the second plurality of Y lines to the Y line unselect voltage.

56 Claims, 19 Drawing Sheets

REDUCED COMPLEXITY ARRAY LINE DRIVERS FOR 3D MATRIX ARRAYS

BACKGROUND

The present invention relates to semiconductor integrated circuits containing memory arrays, and particularly those arrays incorporating array lines having extremely small pitch, and more particularly those having a three-dimensional memory array.

Semiconductor integrated circuits have progressively reduced their feature linewidths into the deep sub-micron regime. Moreover, recent developments in certain memory cell technologies have resulted in word lines and bit line having an extremely small pitch. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane of memory cells have been fabricated containing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

However, the area required for implementing decoder circuits for word lines and bit lines has not achieved such dramatic reductions. Consequently, interfacing the word line decoders and bit line decoders to such tightly spaced word lines and bit lines within such very dense arrays has become extremely difficult, and limits the density of memory arrays otherwise achievable. There remains a continued need for improved decoder structures capable of interfacing with large numbers of array lines having a very small pitch, and particularly if such array lines exist on more than one layer, as in a three-dimensional memory array having more than one plane or level of memory cells.

Additionally, integrated circuits incorporating a passive element memory array require a high-voltage and high-current programming voltage source due to the large number of leakage paths in the array and the high voltage required to program the element conductivity. The leakage current represents a significant portion of the power dissipation of such circuits during programming. There remains a need for improved performance of such circuits, reduced leakage currents when writing, and faster write time of a selected memory cell.

SUMMARY

A representative embodiment relates to a method of biasing a nonvolatile memory array. The nonvolatile memory array includes a first plurality of Y lines, a second plurality of Y lines, a plurality of X lines, a first plurality of two terminal memory cells and a second plurality of two terminal memory cells. Each first memory cell is coupled to one of the first plurality of Y lines and one of the plurality of X lines. Each second memory cell is coupled to one of the second plurality of Y lines and one of the plurality of X lines. Substantially all of the first plurality and second plurality of Y lines are driven to a Y line unselect voltage. At least one selected Y line of the first plurality of Y lines is driven to a Y line select voltage while floating remaining Y lines of the first plurality of Y lines and while driving substantially all of the second plurality of Y lines to the Y line unselect voltage.

Another representative embodiment relates to a nonvolatile memory array. The nonvolatile memory array includes a first plurality of Y lines, a first plurality of Y line drivers, a first bias generating circuit, a first decoder, a second plurality of Y lines, a second plurality of Y line drivers, a second bias generating circuit, a second decoder, a plurality of X lines, a plurality of X line drivers, and a plurality of memory cells. The first plurality of Y line drivers is electrically connected to the first plurality of Y lines. The first bias generating circuit is electrically connected to a first source of each of the first plurality of Y line drivers. The first bias generating circuit is coupled to a Y line select voltage and a Y line unselect voltage. The first decoder controls the first plurality of Y line drivers. The second plurality of Y line drivers is electrically connected to the second plurality of Y lines. The second bias generating circuit is electrically connected to a second source of each of the second plurality of Y line drivers. The second bias generating circuit is coupled to the Y line select voltage and the Y line unselect voltage. The second decoder controls the first plurality of Y line drivers. The plurality of X line drivers is electrically connected to the plurality of X lines. The plurality of X line drivers comprise a X line select voltage node and a X line unselect voltage node. Each memory cell is a two-terminal memory cell and is electrically connected to one of the either the first or second plurality of Y lines and one of the plurality of X lines.

Another representative embodiment relates to a nonvolatile memory array. The nonvolatile memory array includes a first plurality of Y lines, a first plurality of Y line drivers, a first bias generating circuit, a first decoder, a second plurality of Y lines, a second plurality of Y line drivers, a second bias generating circuit, a second decoder, a plurality of X lines, a plurality of X line drivers, and a plurality of memory cells. The first plurality of Y line drivers is electrically connected to the first plurality of Y lines. A first source of each of the first plurality of Y line drivers is electrically connected to a Y line select voltage node. The first bias generating circuit is electrically connected to a first body of each of the first plurality of Y line drivers. The first bias generating circuit is coupled to a Y line select biasing voltage and a Y line unselect biasing voltage. The first decoder controls the first plurality of Y line drivers. The second plurality of Y line drivers is electrically connected to the second plurality of Y lines. A second source of each of the second plurality of Y line drivers is electrically connected to a second Y line select voltage node. The second bias generating circuit is electrically connected to a second body of each of the second plurality of Y line drivers. The second bias generating circuit is coupled to the Y line select biasing voltage and the Y line unselect biasing voltage. The second decoder controls the first plurality of Y line drivers. The plurality of X line drivers is electrically connected to the plurality of X lines. The plurality of X line drivers comprise a X line select voltage node and a X line unselect voltage node. Each memory cell is a two-terminal memory cell and is electrically connected to one of the either the first or second plurality of Y lines and one of the plurality of X lines.

Another representative embodiment relates to a nonvolatile memory array. The nonvolatile memory array includes a plurality of Y lines, a plurality of Y line drivers, a decoder, a plurality of X lines, a plurality of X line drivers, a plurality of memory cells, and a plurality of drainage X lines. The plurality of Y lines includes a plurality of Y drainage groups. The plurality of Y line drivers is electrically connected to the plurality of Y lines. Each of the plurality of Y line drivers provides a Y line select voltage and a Y line unselect voltage. The decoder controls the plurality of Y line drivers. The plurality of X line drivers is electrically connected to the plurality of X lines. The plurality of X line drivers comprise a X line select voltage node and a X line unselect voltage node. Each memory cell is a two-terminal memory cell. Each memory cell is electrically connected to one of the plurality of Y lines and one of the plurality of X lines. Each of the plurality of drainage X lines is exclusively electrically connected to a Y drainage group of the plurality of Y drainage groups.

DETAILED DESCRIPTION

A structure and method for biasing reduced complexity array line drivers for non-volatile memory devices, such as three-dimensional non-volatile memory matrix arrays, are described. In the following description, for purposes of explanation, numerous specific details are set forth to provide a thorough understanding of exemplary embodiments of the invention. It will be evident, however, to one skilled in the art that the invention may be practiced without these specific details. The terms word line, bit line, x-line and y-line are used interchangeably. The drawings are not to scale. In other instances, well-known structures and devices are shown in simplified form to facilitate description of the exemplary embodiments. Preferably, word lines refer to row or X lines while bit lines refer to column or Y lines.

In the following description, for ease of explanation, the terms "bit line" and "word line" are used. The features described by the terms bit line (BL) and word line (WL) can be interchanged. A bit line can be a X line or a Y line. Likewise, a word line can be a Y line or a X line.

"Substantially" means most, where one or a few are not necessarily included; and also includes the entirety. "Substantially" also means most or all in an area local to a selected line. For example, in an array with 100 columns, substantially can mean about 20 columns adjacent to a selected column. In cases where an array includes many subarrays "substantially" is related to the subarray related to the selected line.

Figure 1:
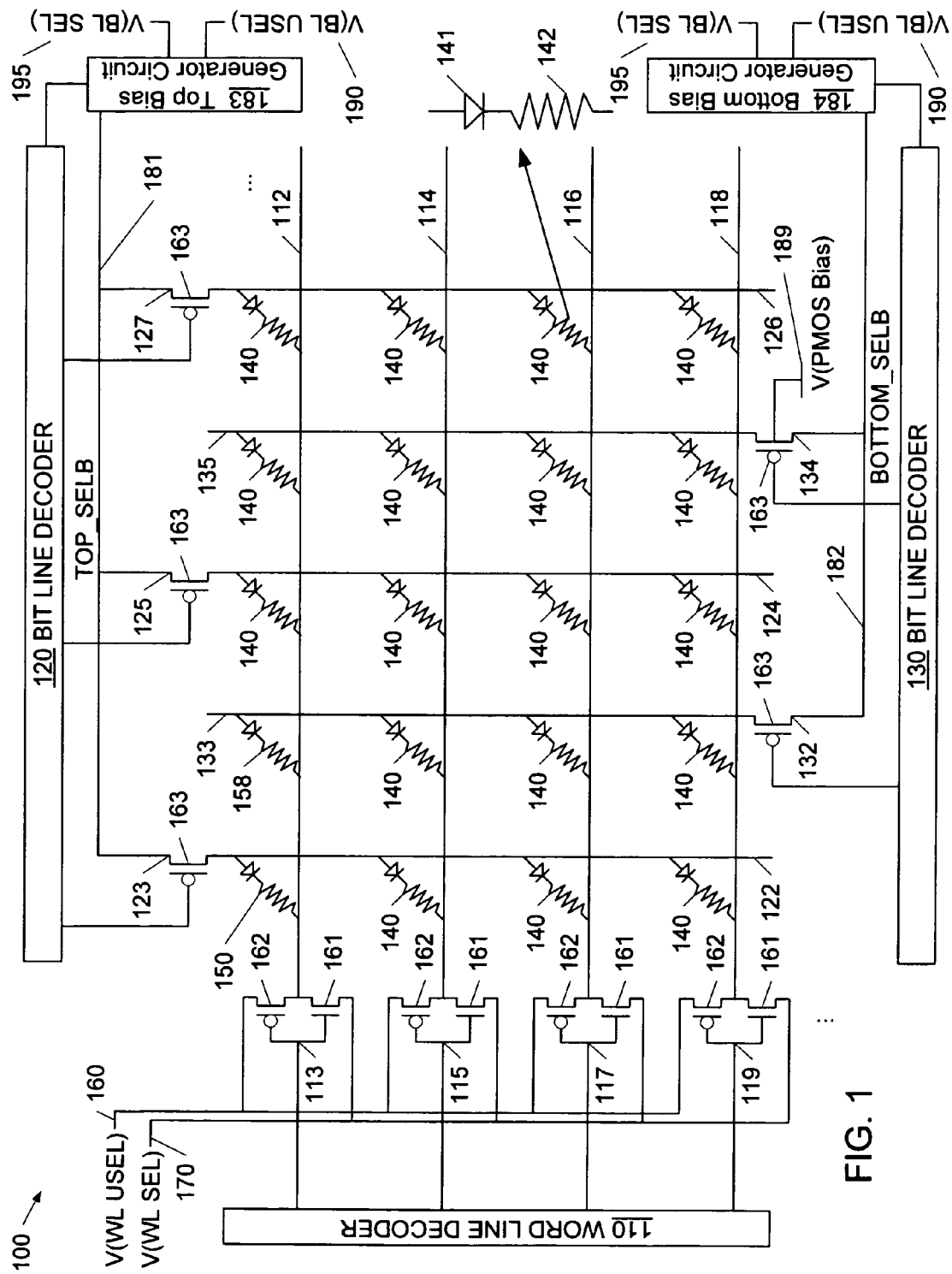
FIG. 1 is a diagram of a memory cell array with a single device bit line driver and a dual device word line driver in accordance with a representative embodiment.

Memory Cell Array with a Single Device Bit Line Driver and a Dual Device Word Line Driver Referring to FIG. 1, a diagram of a memory cell array 100 with a single device bit line driver and a dual device word line driver in accordance with a representative embodiment is shown. The memory cell array 100 includes a word line (i.e., row) decoder 110, a top bit line (i.e., column) decoder 120, a bottom bit line (i.e., column) decoder 130, word lines 112, 114, 116 and 118, top bit lines (i.e., connected to top bit line decoder 120) 122, 124 and 126, bottom bit lines (i.e., connected to bottom bit line decoder 130) 133 and 135, and memory cells 140, 150 and 158. Each of the memory cells 140, 150 and 158 is connected to one bit line (for instance, memory cell 158 is connected to bottom bit line 133) and one word line (for instance, memory cell 158 is connected to word line 112). Each of the memory cells 140, 150 and 158 include a current steering element 141 and a resistivity switching storage element 142. The current steering element 141 can be, for example, a diode including a p-n semiconductor diode, a p-i-n semiconductor diode, a metal insulator metal (MIM) diode, or a metal insulator-insulator metal (MIIM) diode. The current steering element 141 can be designed to operate using various operating switching voltages, for example, 1.5 V, 2 V, 3 V, 5 V, or 12 V. The resistivity switching storage element 142 can be, for example, a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material. The resistivity switching storage element 142 can be a single state or multi-state one-time-programmable or re-writable cell. Thus, preferably, each memory cell is a two terminal memory cell.

The word line decoder 110 controls dual device drivers 113, 115, 117 and 119. Each of the dual device drivers 113, 115, 117 and 119 drives one of the word lines 112, 114, 116 and 118, respectively. Each of the dual device drivers 113, 115, 117 and 119 includes a PMOS transistor 162 and a NMOS transistor 161. In this example, the NMOS transistor 161 is connected (e.g., the source region of the NMOS is connected) to a word line select voltage source 170 (V(WL SEL)). The word line select voltage source 170 provides a word line select voltage of about −0.5 V to 0.5 V. The word line select voltage source 170 can also be ground. The PMOS transistor 162 is connected (e.g., the source region of the PMOS is connected) to a word line unselect voltage source 160 (V(WL USEL)). The memory cell array 100 has a main supply voltage Vpp. The word line unselect voltage source 160 provides a word line unselect voltage equal to about Vpp, i.e., the main supply voltage, although various relative voltages can be chosen to control the amount of leakage through the memory cells. Generally, the biasing voltages can be adjusted to account for the turn-on voltages of the memory cells. The word line unselect voltage source 160 is about 1 V to 12 V. Hence, when the word line decoder 110 applies a select control voltage to the dual device drivers 113, 115, 117 and 119, the NMOS transistor 161 is activated and applies (e.g., via the NMOS drain) the word line select voltage to the word lines 112, 114, 116 and 118; the PMOS transistor 162 is deactivated. Conversely, the when the word line decoder 110 applies an unselect control voltage to the dual device drivers 113, 115, 117 and 119, the PMOS transistor 162 is activated (e.g., the word line unselect voltage source 160 is applied to the PMOS source) and applies the word line unselect voltage to the word lines 112, 114, 116 and 118; the NMOS transistor 161 is deactivated.

The top bit line decoder 120 controls top single device drivers 123, 125 and 127. Each of the top single device drivers 123, 125 and 127 drives one of the top bit lines 122, 124 and 126, respectively. The bottom bit line decoder 130 controls bottom single device drivers 132 and 134. Each of the bottom single device drivers 132 and 134 drives one of the bottom bit lines 133 and 135, respectively. (Note: top and bottom are relative terms as applied to the figures only). Each of the top single device drivers 123, 125 and 127 and bottom single device drivers 132 and 134 includes a PMOS transistor 163. A body 189 of each of the PMOS transistors 163 can be connected to Vpp ("V(PMOS Bias)").

Each of the top single device drivers 123, 125 and 127 can be connected to a top bias generator circuit 183 by top select bus 181 (TOP_SELB). The top bias generator circuit 183 can be connected to a bit line select voltage source 195 (V(BL SEL)) and a bit line unselect voltage source 190 ("V(BL UNSEL)"). The bit line select voltage source 195 is equal to about Vpp. The bit line select voltage source 195 provides a bit line select voltage of about 1 V to 12 V. The bit line unselect voltage source 190 provides a bit line unselect voltage of about −1 V to 1 V. The bit line unselect voltage source 190 is equal to about the word line select voltage source 170. Thus, the top bias generator circuit 183 can provide either the bit line select voltage source 195 or the bit line unselect voltage source 190 to the top select bus 181.

Each of the bottom single device drivers 132 and 134 can be connected to a bottom bias generator circuit 184 by bottom select bus 182 (BOTTOM_SELB). The bottom bias generator circuit 184 can be connected to the bit line select voltage source 195 (V(BL SEL)) and a bit line unselect voltage source 190 ("V(BL UNSEL)"). The bit line select voltage source 195 is equal to about Vpp. The bit line select voltage source 195 provides a bit line select voltage of about 1 V to 12 V. The bit line unselect voltage source 190 provides a bit line unselect voltage of about −1 V to 1 V. Thus, the bottom bias generator circuit 184 can provide either the bit line select voltage source 195 or the bit line unselect voltage source 190 to the bottom select bus 182. Alternatively, the bit line select voltage sources for the top and bottom can be provided separately.

The top bit lines 122, 124 and 126 are interleaved with the bottom bit lines 133 and 135. The top single device drivers 123, 125 and 127 and bottom single device drivers 132 and 134 are on opposite sides of the array. Hence the coupling capacitance from a selected bit line is always to interleaved bit lines that are driven from the opposite side of the array.

Alternatively, the orientation of the memory cells 140, 150 and 158 can be reversed so their "anodes" and "cathodes" are interchanged. The PMOS transistors are replaced with NMOS transistors and vice-versa. Hence, the select and unselect voltages are reversed in polarity. Alternatively, the top single device drivers, the bottom single device drivers, and the dual device drivers can optionally include pull-up or pull-down resistors.

Figure 2:
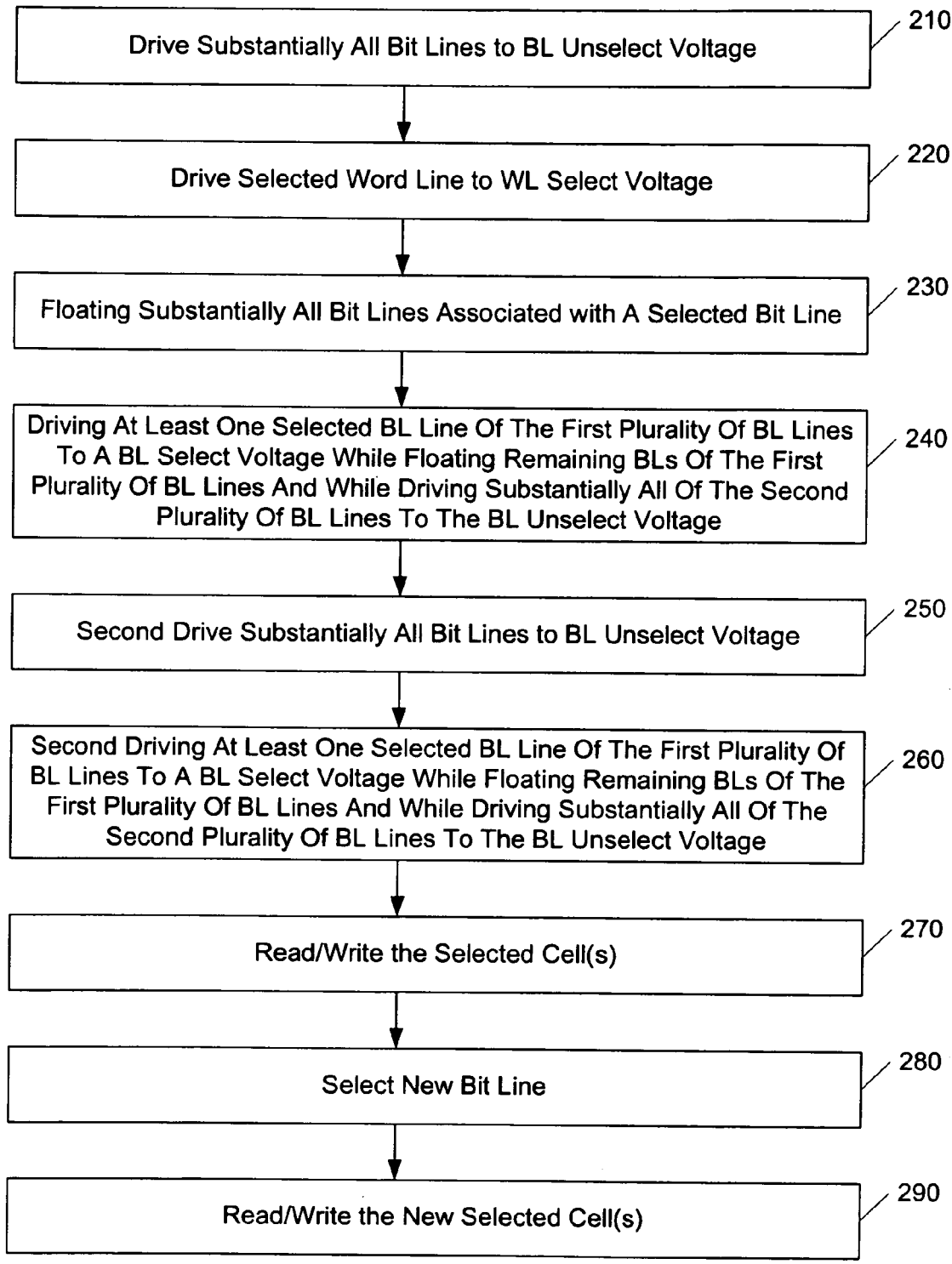
FIG. 2 is a flowchart of a memory cell array biasing sequence in accordance with a representative embodiment.
Figure 3:
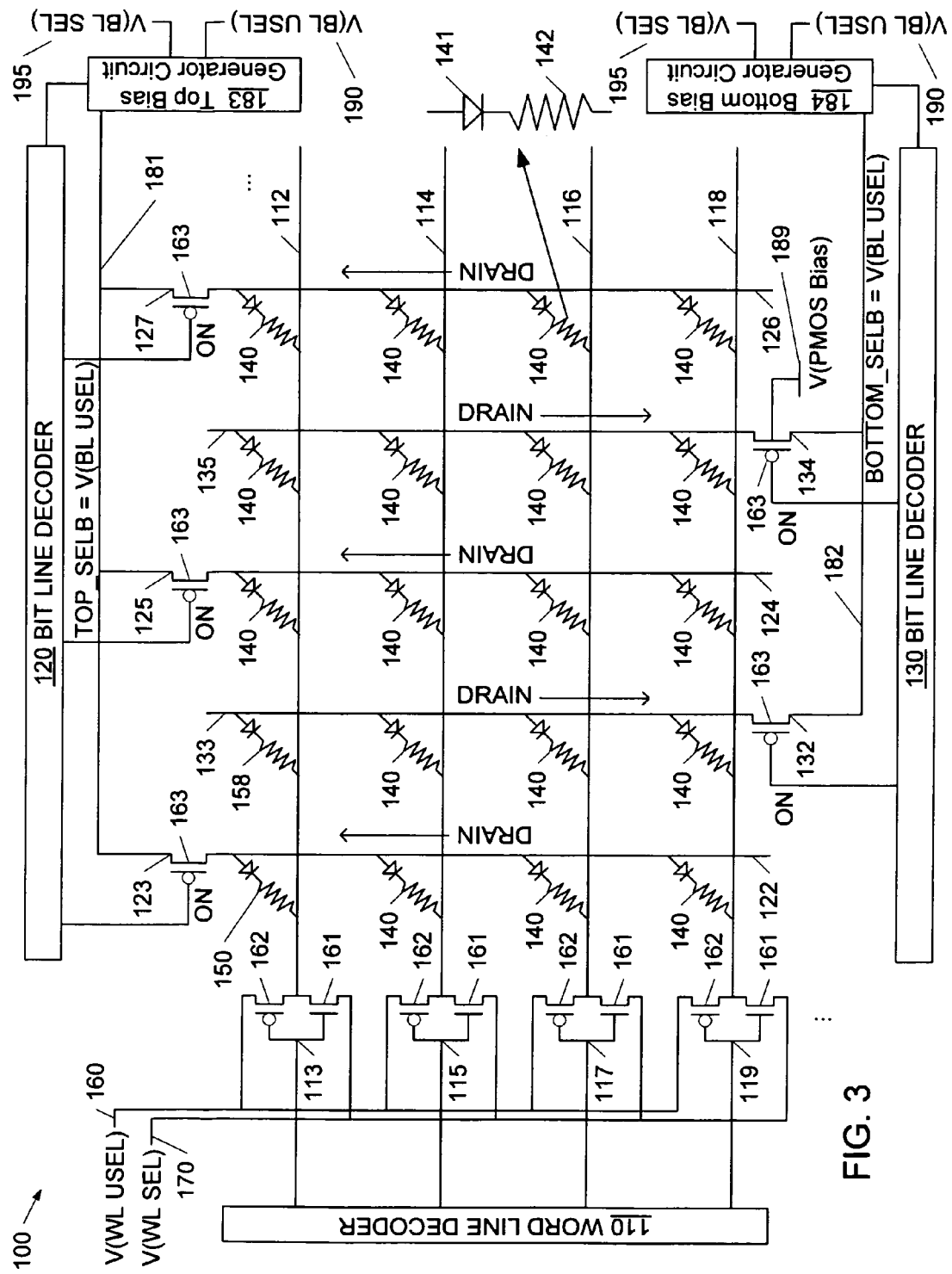
FIG. 3 is a diagram of the memory cell array of FIG. 1 where the bit lines are pulled to the bit line unselect voltage in accordance with a representative embodiment.

Referring to FIG. 2, a flowchart of a memory cell array biasing sequence in accordance with a representative embodiment is shown. In an operation 210, the top bit lines 122, 124 and 126 and the bottom bit lines 133 and 135 are pulled to the bit line unselect voltage. In this example, a 5 V system is described (i.e., Vpp=5 V) and the bit line unselect voltage is about 0 V, although various relative voltages can be chosen to control the amount of leakage through the memory cells. Referring now to FIG. 3, a diagram of the memory cell array of FIG. 1 where the bit lines are pulled to the bit line unselect voltage in accordance with a representative embodiment is shown. During operation 210, the top bias generator circuit 183 provides the bit line unselect voltage to the top select bus 181. The bottom bias generator circuit 184 provides the bit line unselect voltage to the bottom select bus 182. The gates of the PMOS transistors in the top single device drivers 123, 125 and 127 and the bottom single device drivers 132 and 134 are turned ON. Consequently, the top bit lines 122, 124 and 126 and the bottom bit lines 133 and 135 are pulled to the bit line unselect voltage through the top single device drivers 123, 125 and 127 and the bottom single device drivers 132 and 134, respectively. Thus, charge is drained from the bit lines. Note that pulled to the bit line unselect voltage includes the case where the PMOS device gate is at ground and the bit line approaches the bit line unselect voltage which may be about 0.5 Volts in what is commonly called source follower transient but does not reach the bit line unselect voltage due to the threshold voltage of the PMOS device being greater than about 0.5 Volts. The bit line is still being pulled to the bit line unselect voltage in the sense that any leakage or noise coupled into the bit line in a direction more positive is drained through the PMOS device to keep the bit line close to the bit line unselect voltage.

Figure 4:
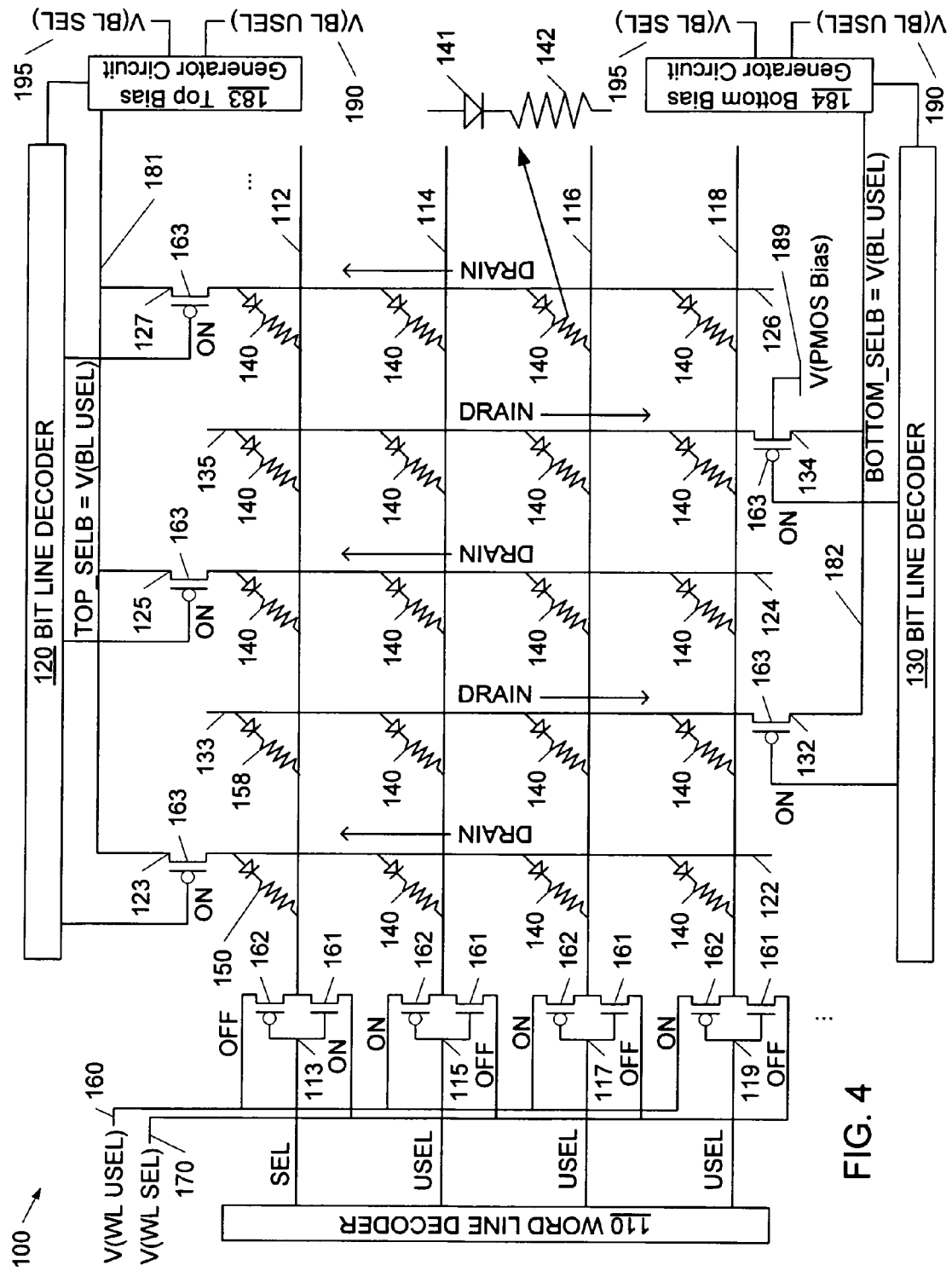
FIG. 4 is a diagram of the memory cell array of FIG. 3 where a selected word line is pulled to the word line select voltage in accordance with a representative embodiment.

Referring again to FIG. 2, in an optional operation 220, a selected word line is driven to the word line select voltage. In this example, memory cell 150 is the cell that is targeted for selection, the word line select voltage source is ground and the word line unselect voltage source is about 5 V. Hence, word line 112 is pulled to ground. The remaining word lines are driven to the word line unselect voltage, although the remaining word lines can be driven to the word line unselect voltage at a later point. Referring now to FIG. 4, a diagram of the memory cell array of FIG. 3 where a selected word line is pulled to the word line select voltage in accordance with a representative embodiment is shown. During operation 220, dual device driver 113 is selected and dual device drivers 115, 117 and 119 are unselected. In dual device driver 113 the PMOS transistor 162 is OFF and the NMOS transistor 161 is ON thereby applying the word line select voltage (e.g., ground) to word line 112. In some embodiments, the word line driver is a multiheaded driver and some of the NMOS transistors 161 function as dual purpose driver devices as described in more detail in U.S. Pat. No. 6,856,572, hereby incorporated for all purposes.

In dual device drivers 115, 117 and 119 the PMOS transistor 162 is ON and the NMOS transistor 161 is OFF thereby applying the word line unselect voltage (e.g., 5 V) to word lines 114, 116 and 118, respectively. During operation 220, the top bit lines 122, 124 and 126 and the bottom bit lines 133 and 135 can continue to drain through the top single device drivers 123, 125 and 127 and the bottom single device drivers 132 and 134, respectively. Operation 220 can be skipped, for example, if a word line is previously selected or does not need to be selected for an associated memory operation.

Figure 5:
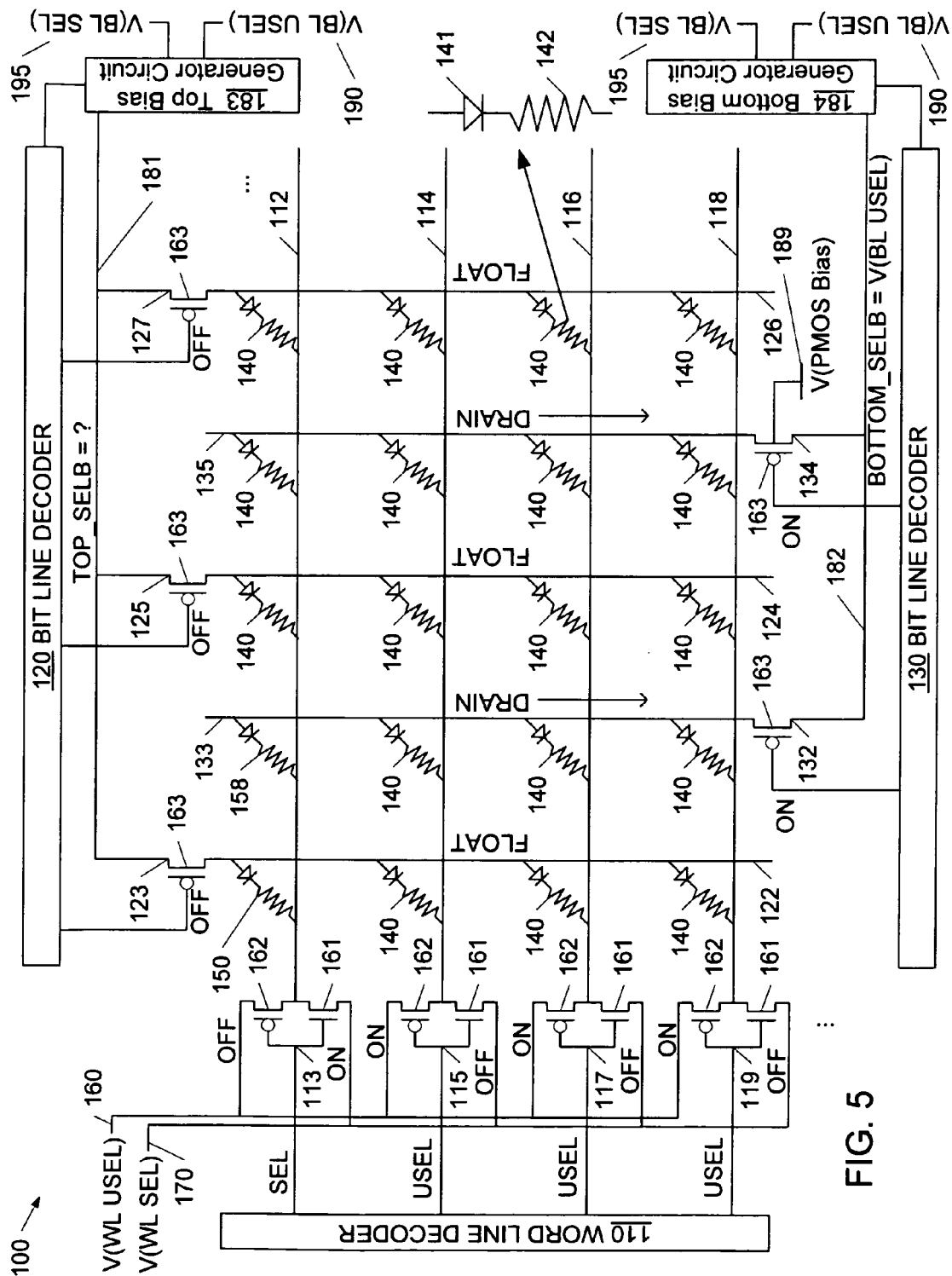
FIG. 5 is a diagram of the memory cell array of FIG. 4 where the top bit lines are floated in accordance with a representative embodiment.

Referring again to FIG. 2, in an optional operation 230, the top bit lines 122, 124 and 126 are floated. The floating allows a time period for the top bias generator circuit 183 to change the top select bus 181 (TOP_SELB) from the bit line unselect voltage to the bit line select voltage. Referring now to FIG. 5, a diagram of the memory cell array of FIG. 4 where the top bit lines are floated in accordance with a representative embodiment is shown. During operation 230, the gates of the PMOS transistors in the top single device drivers 123, 125 and 127 turned OFF. Consequently, the top bit lines 122, 124 and 126 float. Alternatively, the bottom bit lines 133 and 135 can also be floated. Operation 230 can be skipped, for example, if the transition of the top select bus from the bit line unselect voltage to the bit line select voltage can be synchronized with selecting a bit line.

Figure 6:
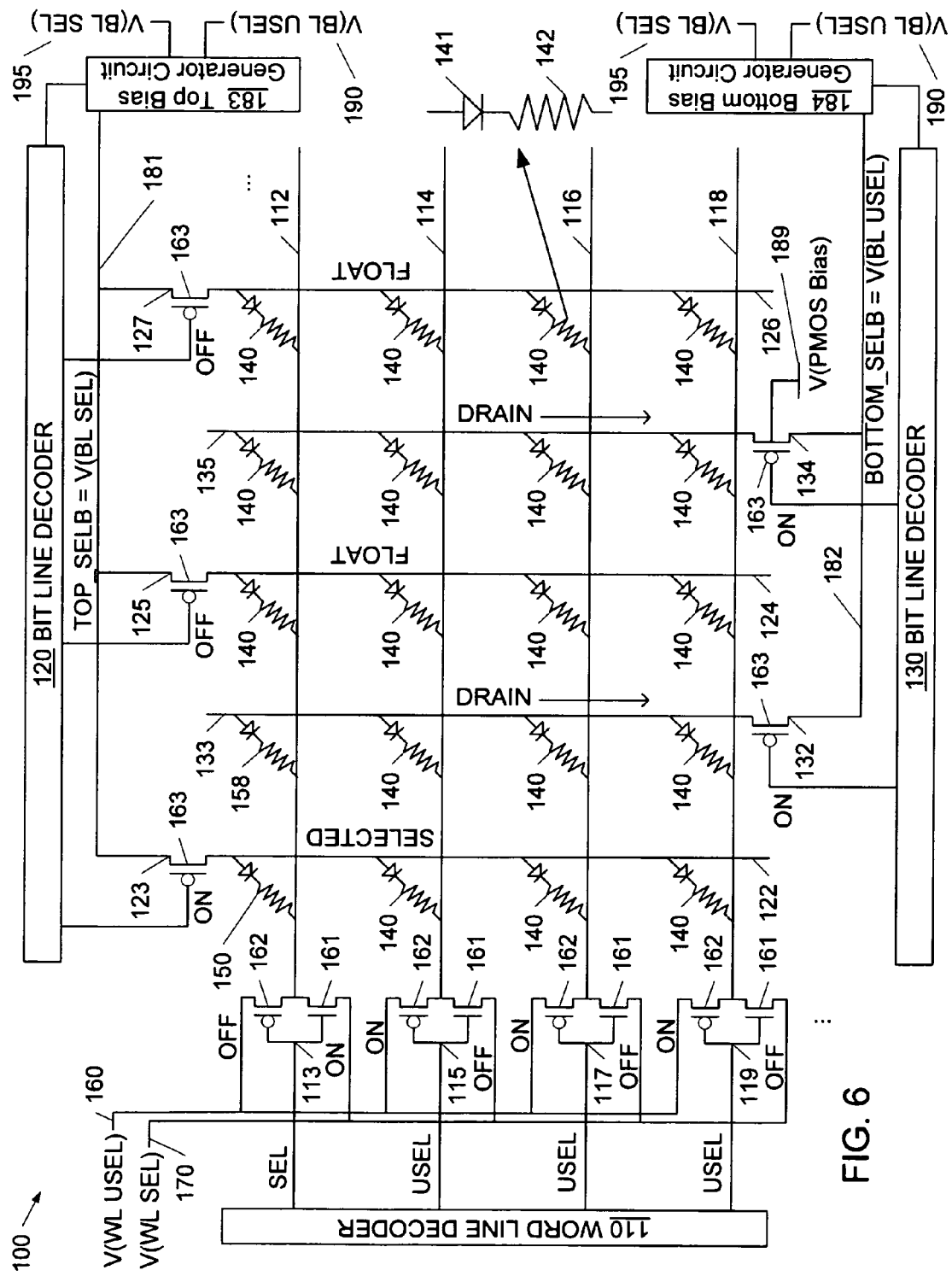
FIG. 6 is a diagram of the memory cell array of FIG. 5 where a selected bit line is driven to the bit line select voltage a first time in accordance with a representative embodiment.

Referring again to FIG. 2, in an operation 240, a selected bit line is driven to the bit line select voltage. As before, memory cell 150 is the cell that is targeted for selection. In this example, the bit line select voltage is about 5 V. Hence, bit line 122 is driven to about 5 V. The remaining top bit lines 124 and 126 continue to float, and the bottom bit lines 133 and 135 can continue to drain. Referring now to FIG. 6, a diagram of the memory cell array of FIG. 5 where a selected bit line is driven to the bit line select voltage a first time in accordance with a representative embodiment is shown. During operation 240, the top bias generator circuit 183 provides to the bit line select voltage to the top select bus 181 (TOP_SELB). The top single device driver 123 is selected while the remaining top single device drivers 125 and 127 are deselected. The bottom single device drivers 132 and 134 continue to drain. Specifically, in top single device driver 123 the PMOS transistor is ON thereby applying the bit line select voltage (e.g., 5 V) to top bit line 122. In top single device drivers 125 and 127 the PMOS transistor is OFF. Optionally, at this point, the selected cell(s) can be read, written, etc.

Referring again to FIG. 2, in an optional operation 250, the top bit lines 122, 124 and 126 and the bottom bit lines 133 and 135 are pulled to the bit line unselect voltage. As in FIG. 3, the top bias generator circuit 183 provides the bit line unselect voltage to the top select bus 181. The bottom bias generator circuit 184 provides the bit line unselect voltage to the bottom select bus 182. The gates of the PMOS transistors in the top single device drivers 123, 125 and 127 and the bottom single device drivers 132 and 134 are turned ON. Consequently, the top bit lines 122, 124 and 126 and the bottom bit lines 133 and 135 are pulled to the bit line unselect voltage through the top single device drivers 123, 125 and 127 and the bottom single device drivers 132 and 134, respectively. Thus, charge is drained from the bit lines. However, the selected word line can be held at the word line select voltage and the remaining word lines can be held at the word line unselect voltage.

Referring again to FIG. 2, in an optional operation 260, the selected bit line is driven to the bit line select voltage a second time. As in FIG. 6, the top bias generator circuit 183 provides the bit line select voltage to the top select bus 181 (TOP_SELB). The top single device driver 123 is selected while the remaining top single device drivers 125 and 127 are deselected. The bottom single device drivers 132 and 134 continue to drain. Specifically, in top single device driver 123 the PMOS transistor is ON thereby applying the bit line select voltage (e.g., 5 V) to top bit line 122. In top single device drivers 125 and 127 the PMOS transistor is OFF. The selected word line can be held at the word line select voltage and the remaining word lines can be held at the word line unselect voltage.

Referring again to FIG. 2, in an operation 270, the selected memory cell 150 is now biased so that its diode conducts and the memory cell array 100 has been substantially biased for a write operation. A write circuit is electrically connected to the selected memory cell 150 through the word line decoder 110 and the top bit line decoder 120. Accordingly, the write circuit applies a current to the selected memory cell 150 and writes its state. Alternatively, the selected memory cell 150 can be read by applying about 2 Volts to bias selected bit lines and unselected word lines. A current sensing circuit is electrically connected to the selected memory cell 150 through the word line decoder 110 and the top bit line decoder 120. Accordingly, the current sensing circuit applies a current to the selected memory cell 150 and determines its state. The discharging cycle described above can be performed periodically or every time that a new memory cell is selected for a read or write as described above.

In an operation 280, a different bit line can be selected such as bottom bit line 133. Bit line 122 is unselected. A new selected memory cell 158 is now selected and biased.

In an operation 290, the new selected memory cell 158 is now properly biased so that its diode conducts and the memory cell array 100 has been substantially discharged. A current sensing circuit is electrically connected to the selected memory cell 158 through the word line decoder 110 and the top bit line decoder 120. Accordingly, the current sensing circuit applies a current to the selected memory cell 158 and determines its state. Alternatively, the selected memory cell 158 can be programmed. Alternatively, multiple cells can be selected at once or in immediate succession. Advantageously, the memory cell array 100 can be read and programmed using lower voltages and currents.

Figure 7:
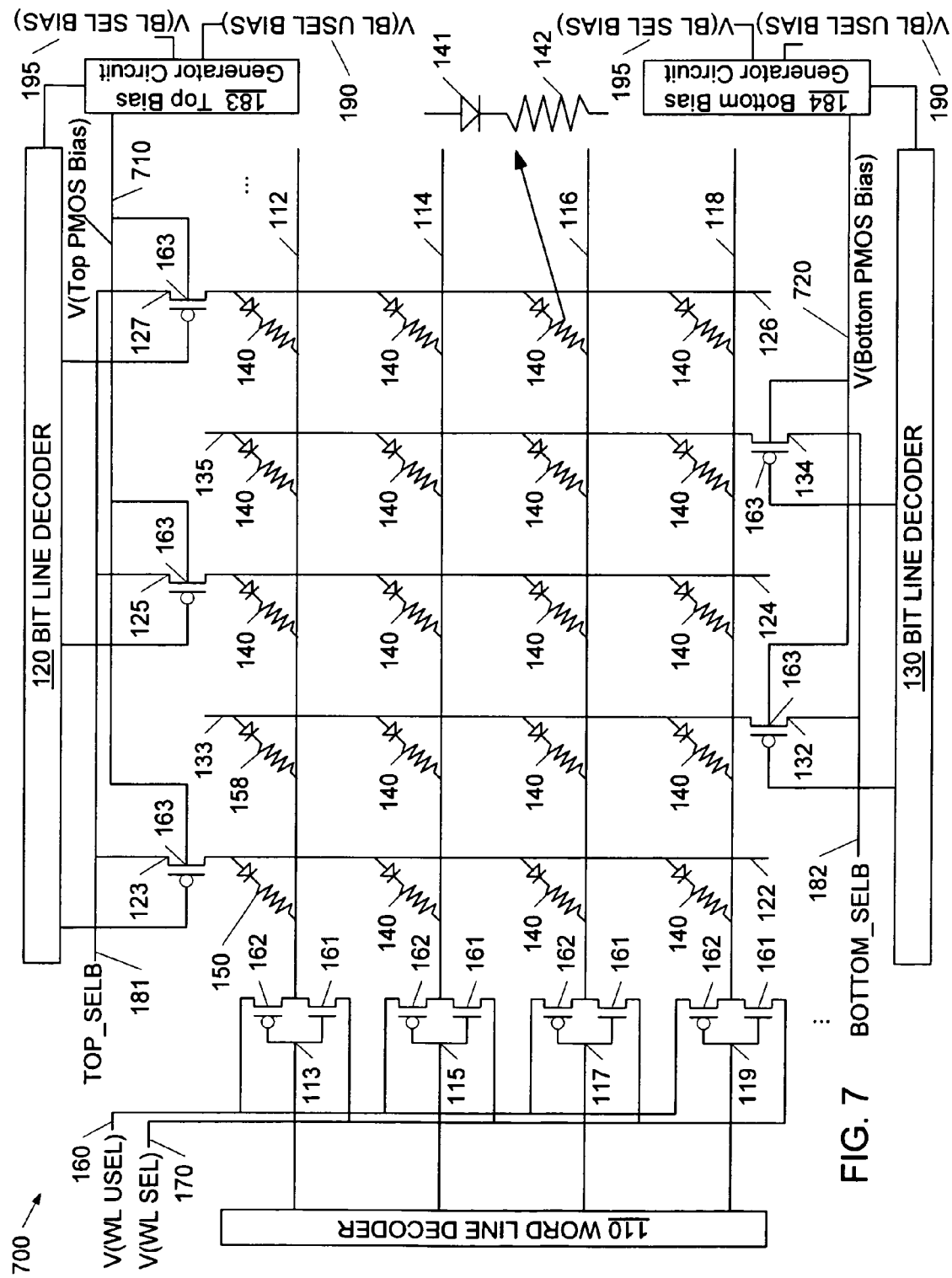
FIG. 7 is a diagram of a memory cell array with a single device bit line driver and a dual device word line driver using a well diode in accordance with a representative embodiment.

Memory Cell Array with a Single Device Bit Line Driver and a Dual Device Word Line Driver Using a Well Diode Referring to FIG. 7, a diagram of a memory cell array 700 with a single device bit line driver and a dual device word line driver using a well diode in accordance with a representative embodiment is shown. The memory cell array 700 includes a word line (i.e., row) decoder 110, a top bit line (i.e., column) decoder 120, a bottom bit line (i.e., column) decoder 130, word lines 112, 114, 116 and 118, top bit lines (i.e., connected to top bit line decoder 120) 122, 124 and 126, bottom bit lines (i.e., connected to bottom bit line decoder 130) 133 and 135, and memory cells 140, 150 and 158. Each of the memory cells 140, 150 and 158 is connected to one bit line (for instance, memory cell 158 is connected to bottom bit line 133) and one word line (for instance, memory cell 158 is connected to word line 112). Each of the memory cells 140, 150 and 158 include a current steering element 141 and a resistivity switching storage element 142. The current steering element 141 can be, for example, a diode including a p-n semiconductor diode, a p-i-n semiconductor diode, a metal insulator metal (MIM) diode, or a metal insulator-insulator metal (MIIM) diode. The current steering element 141 can be designed to operate using various operating switching voltages, for example, 1.5 V, 2 V, 3 V, 5 V, or 12 V. The resistivity switching storage element 142 can be, for example, a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material. The resistivity switching storage element 142 can be a single state or multi-state one-time-programmable or re-writable cell. Thus, preferably, each memory cell is a two terminal memory cell.

The word line decoder 110 controls dual device drivers 113, 115, 117 and 119. Each of the dual device drivers 113, 115, 117 and 119 drives one of the word lines 112, 114, 116 and 118, respectively. Each of the dual device drivers 113, 115, 117 and 119 includes a PMOS transistor 162 and a NMOS transistor 161. In this example, the NMOS transistor 161 is connected (e.g., the source region of the NMOS is connected) to a word line select voltage source 170 (V(WL SEL)). The word line select voltage source 170 provides a word line select voltage of about −0.5 V to 0.5 V. The word line select voltage source 170 can also be ground. The PMOS transistor 162 is connected (e.g., the source region of the PMOS is connected) to a word line unselect voltage source 160 (V(WL USEL)). The memory cell array 700 has a main supply voltage Vpp. The word line unselect voltage source 160 provides a word line unselect voltage equal to about Vpp, i.e., the main supply voltage. The word line unselect voltage source 160 is about 1 V to 12 V. Hence, when the word line decoder 110 applies a select control voltage to the dual device drivers 113, 115, 117 and 119, the NMOS transistor 161 is activated and applies (e.g., via the NMOS drain) the word line select voltage to the word lines 112, 114, 116 and 118; the PMOS transistor 162 is deactivated. Conversely, the when the word line decoder 110 applies an unselect control voltage to the dual device drivers 113, 115, 117 and 119, the PMOS transistor 162 is activated (e.g., the word line unselect voltage source 160 is applied to the PMOS source) and applies the word line unselect voltage to the word lines 112, 114, 116 and 118; the NMOS transistor 161 is deactivated.

The top bit line decoder 120 controls top single device drivers 123, 125 and 127. Each of the top single device drivers 123, 125 and 127 drives one of the top bit lines 122, 124 and 126, respectively. The bottom bit line decoder 130 controls bottom single device drivers 132 and 134. Each of the bottom single device drivers 132 and 134 drives one of the bottom bit lines 133 and 135, respectively. (Note: top and bottom are relative terms as applied to the figures only). Each of the top single device drivers 123, 125 and 127 and bottom single device drivers 132 and 134 includes a PMOS transistor 163. Each of the top single device drivers 123, 125 and 127 can be connected to a top select bus 181 (TOP_SELB) which is used to assert data on a selected bit line. Each of the bottom single device drivers 132 and 134 can be connected to a bottom select bus 182 (BOTTOM_SELB) which is used to assert data on a selected bit line. The top select bus and bottom select bus can be the same or separate.

The body of each of the PMOS transistors 163 of each of the top single device drivers 123, 125 and 127 can be connected to a top bias generator circuit 183 by top PMOS bias 710 ("V(Top PMOS Bias)"). The top bias generator circuit 183 can be connected to a bit line select biasing voltage source 195 (V(BL SEL BIAS)) and a bit line unselect biasing voltage source 190 ("V(BL UNSEL)"). The body of each of the PMOS transistors 163 of each of the bottom single device drivers 132 and 134 can be connected to a bottom bias generator circuit 184 by bottom PMOS bias 720 ("V(Bottom PMOS Bias)"). The bottom bias generator circuit 184 can be connected to the bit line select biasing voltage source 195 (V(BL SEL BIAS)) and the bit line unselect biasing voltage source 190 ("V(BL UNSEL)"). The bit line select biasing voltage source 195 is equal to about Vpp. The bit line select biasing voltage source 195 provides a bit line select voltage of about 1 V to 12 V. The bit line unselect biasing voltage source 190 provides a bit line unselect voltage of about −1 V to 1 V. The bit line unselect voltage source 190 has a voltage equal to about a desired bit line unselect voltage (e.g., 0.7 V) minus a threshold voltage as described below. The bit line unselect biasing voltage source 190 (e.g., 0 V) can be adjusted to account for a diode junction in the single device drivers so that the bit lines see the proper bit line unselect voltage (e.g., 0.7 V).

The bit line unselect biasing voltage source 190 ("V(BL UNSEL)") pulls the bit lines to about −1 V to 1 V through a "well diode" of the PMOS transistors 163. The "well diode" is defined as the p-well to n-well of the PMOS transistor 163 which can act as a diode. The n-well may be a n-type semiconductor substrate or layer, or n-type doped well in a p-type or intrinsic substrate or layer. The p-well may be a source or drain region of the PMOS located in the n-well. The PMOS transistor can be metal oxide semiconductor field effect transistor (MOSFET) type or thin film transistor (TFT) type.

Figure 8:
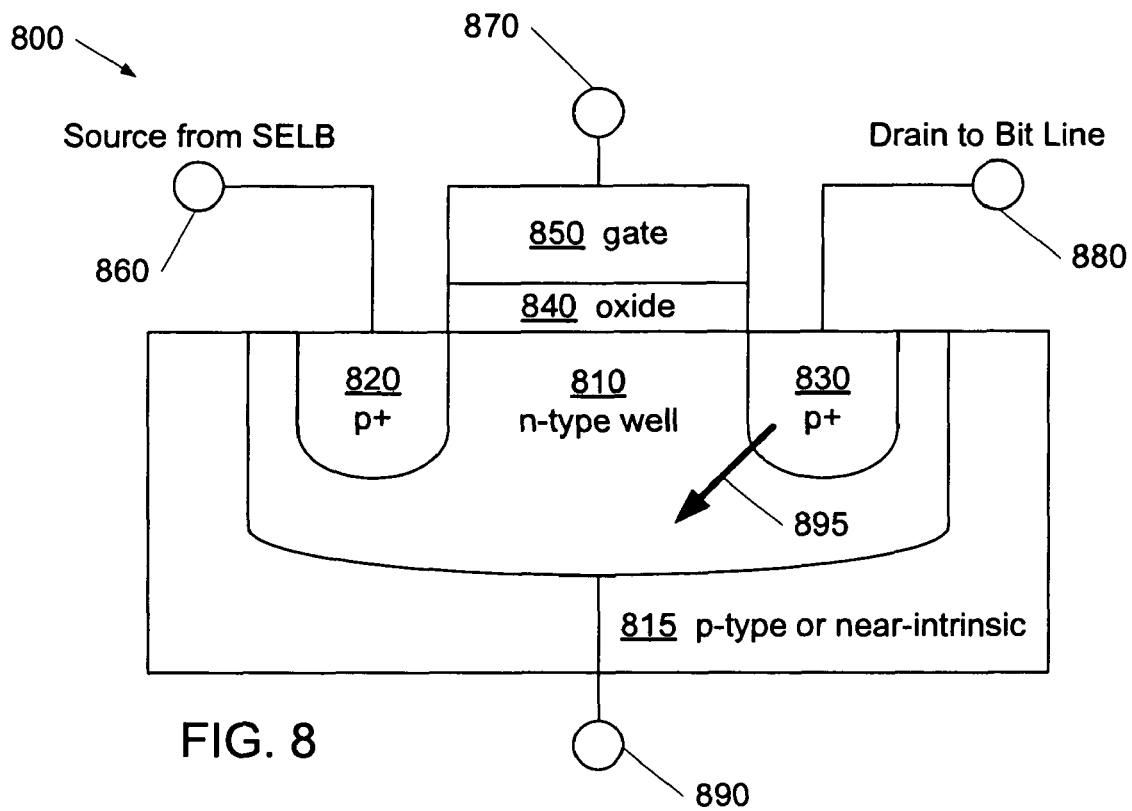
FIG. 8 is a diagram of a PMOS transistor of a single device driver in accordance with a representative embodiment.

Referring to FIG. 8, a diagram of a PMOS transistor 800 of a single device driver in accordance with a representative embodiment is shown. The PMOS transistor 800 includes an n-type well 810, a p-type source 820, a p-type drain 830, an oxide 840, and a gate 850. The n-type well 810 is located in a device layer 815 which can be a p-type or near intrinsic substrate or layer. The p-type source 820 and p-type drain 830 are located in the n-type well 810 on either side of the oxide 840 and gate 850 that are used to form a channel. The source 820 is connected to a source terminal 860 which is connected to a bit line select bus (SELB). The drain 830 is connected to a drain terminal 880 which is connected to a bit line. The gate 850 is connected to a gate terminal 870. The n-type well 810 is connected to a base terminal 890 which can be, for example, biased by the bit line unselect bias voltage source 190 shown in FIG. 7. The p-type drain 830 to n-well 810 of the PMOS transistor 800 (i.e., the "well diode") is indicated by arrow 895.

Figure 9:
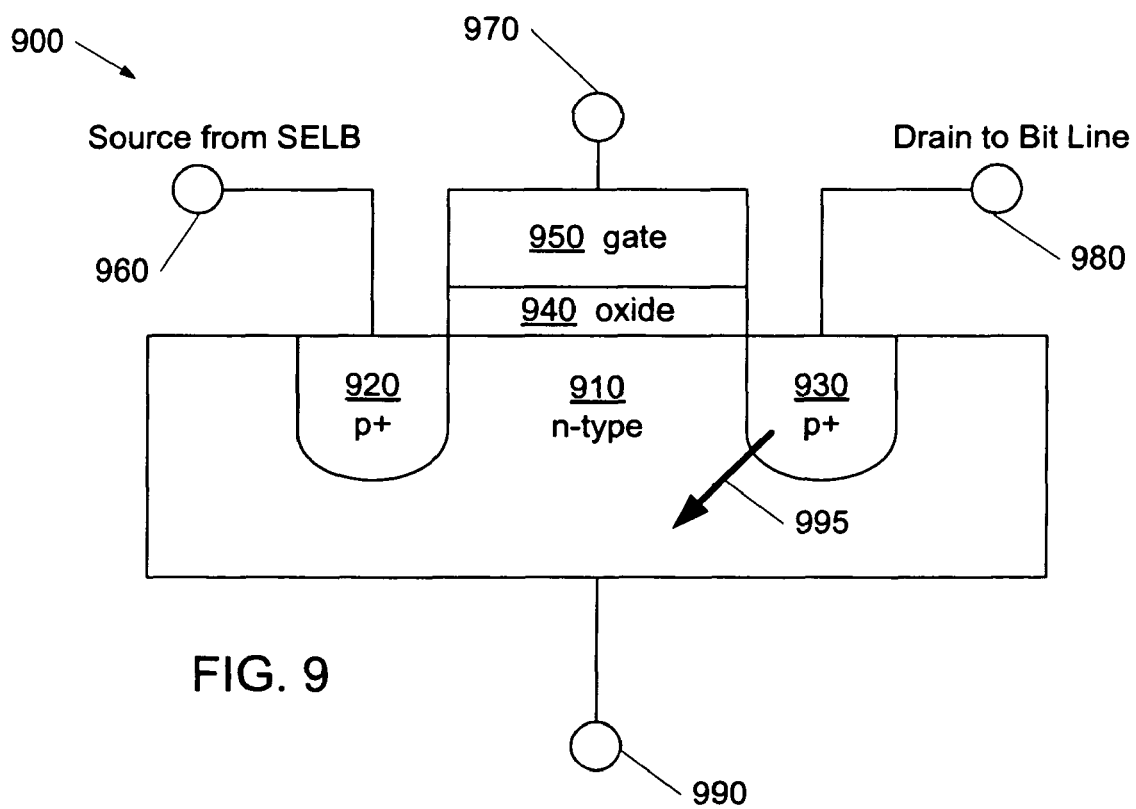
FIG. 9 is a diagram of an alternative PMOS transistor of a single device driver in accordance with a representative embodiment.

Referring to FIG. 9, a diagram of an alternative PMOS transistor 900 of a single device driver in accordance with a representative embodiment is shown. The PMOS transistor 900 includes a n-type layer 910, a p-type source 920, a p-type drain 930, an oxide 940, and a gate 950. The n-type layer 910 can be, for example, an in situ layer of n-type material formed on a substrate or insulator. The source 920 and drain 930 are located in the n-type well 910 on either side of the oxide 940 and gate 950 that are used to form a channel. The source 920 is connected to a source terminal 960 which is connected to a bit line select bus (SELB). The drain 930 is connected to a drain terminal 980 which is connected to a bit line. The gate 950 is connected to a gate terminal 970. The n-type layer 910 is connected to a base terminal 990 which can be, for example, biased by the bit line unselect bias voltage 190 shown in FIG. 7. The diode comprising the drain 930 to n-type layer (i.e., the "n-well") 910 of the PMOS transistor 900 (i.e., the "well diode") is indicated by arrow 995.

Referring again to FIG. 7, the threshold voltage Vt is the effective turn-on voltage of the well diode in each of the PMOS transistors 163. When the body (i.e., "n-well") of the PMOS transistors 163 in the top single device drivers 123, 125 and 127 and bottom single device drivers 132 and 134 are pulled to the bit line unselect biasing voltage by a bias generator circuit, any charge with a potential of greater than a threshold voltage Vt that is on the respective bit lines will leak through the "well diode." Put another way, when the body of a PMOS is biased at the bit line unselect bias voltage, the drain of the PMOS leaks to the body. Thus the respective bit lines enter a state of "partially floating" where the voltage of the bit line can go down but not up. The "well diode" will pull the bit line within Vt of bit line unselect biasing voltage, or approximately the desired bit line unselect voltage.

The top bit lines 122, 124 and 126 are interleaved with the bottom bit lines 133 and 135. The top single device drivers 123, 125 and 127 and bottom single device drivers 132 and 134 are on opposite sides of the array. Hence the coupling capacitance from a selected bit line is always to interleaved bit lines that are driven from the opposite side of the array.

Alternatively, the orientation of the memory cells 140, 150 and 158 can be reversed so their "anodes" and "cathodes" are interchanged. The PMOS transistors are replaced with NMOS transistors and vice-versa. Hence, the select and unselect voltages are reversed in polarity. Alternatively, the top single device drivers, the bottom single device drivers, and the dual device drivers can optionally include pull-up or pull-down resistors.

Figure 10:
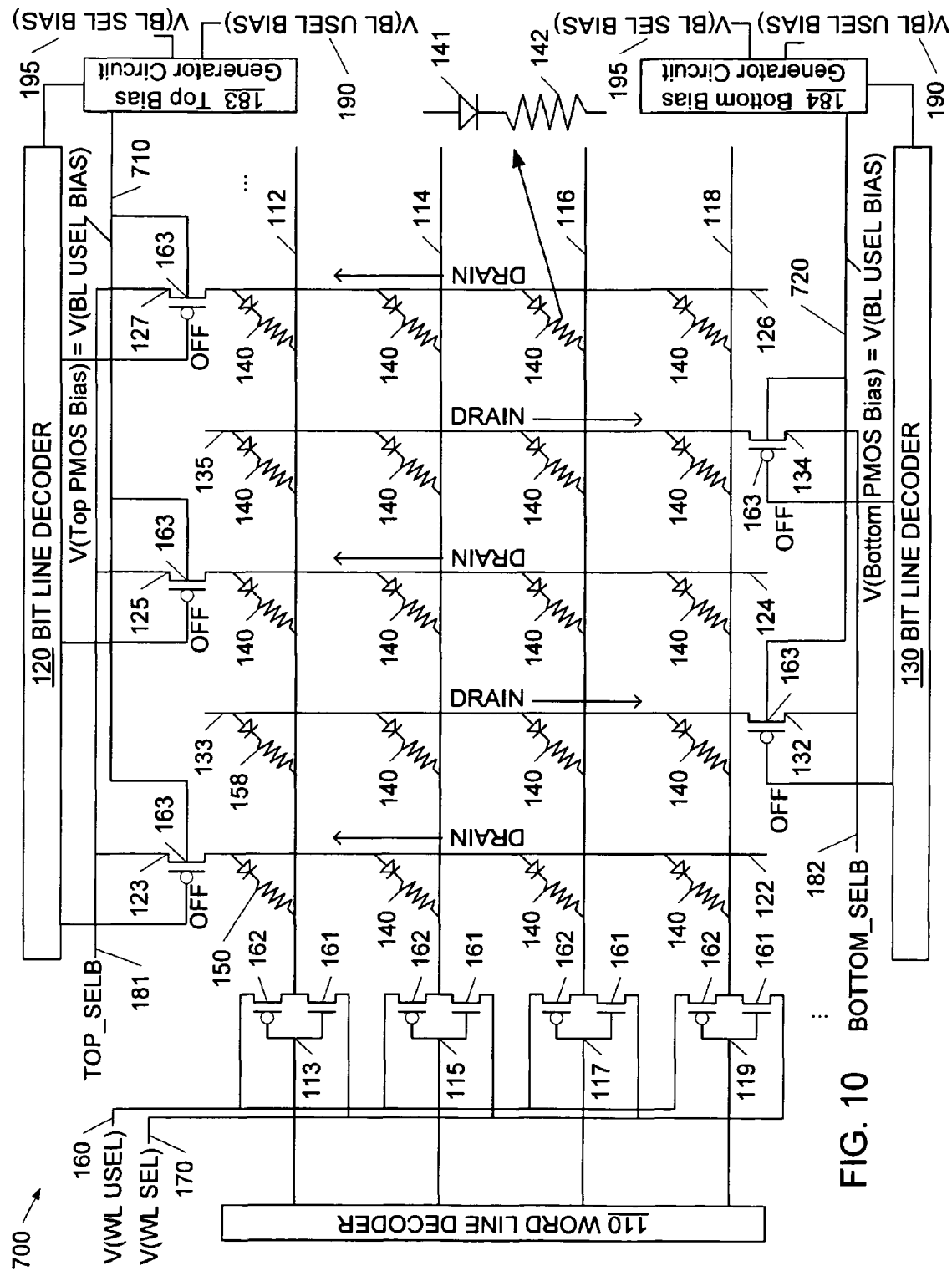
FIG. 10 is a diagram of the memory cell array of FIG. 8 where the bit lines are pulled to the bit line unselect voltage in accordance with a representative embodiment.

Referring again to FIG. 2, the discharge sequence is applied to a memory cell array using a well diode. In an operation 210, the top bit lines 122, 124 and 126 and the bottom bit lines 133 and 135 are pulled to the bit line unselect voltage. In this example, the bit line unselect voltage is about 0.7 V and the bit line biasing unselect voltage is about 0 V. Referring now to FIG. 10, a diagram of the memory cell array of FIG. 8 where the bit lines are pulled to the bit line unselect voltage in accordance with a representative embodiment is shown. During operation 210, the top bias generator circuit 183 provides the bit line biasing unselect voltage to the top PMOS bias 710. The bottom bias generator circuit 184 provides the bit line unselect biasing voltage to the bottom PMOS bias 720. The gates of the PMOS transistors in the top single device drivers 123, 125 and 127 and the bottom single device drivers 132 and 134 are turned OFF. Consequently, the top bit lines 122, 124 and 126 and the bottom bit lines 133 and 135 are pulled to the bit line unselect voltage through the well diodes of the top single device drivers 123, 125 and 127 and the well diodes of the bottom single device drivers 132 and 134, respectively. Thus, charge is drained from the bit lines and the bit lines enter a partially floating state.

Figure 11:
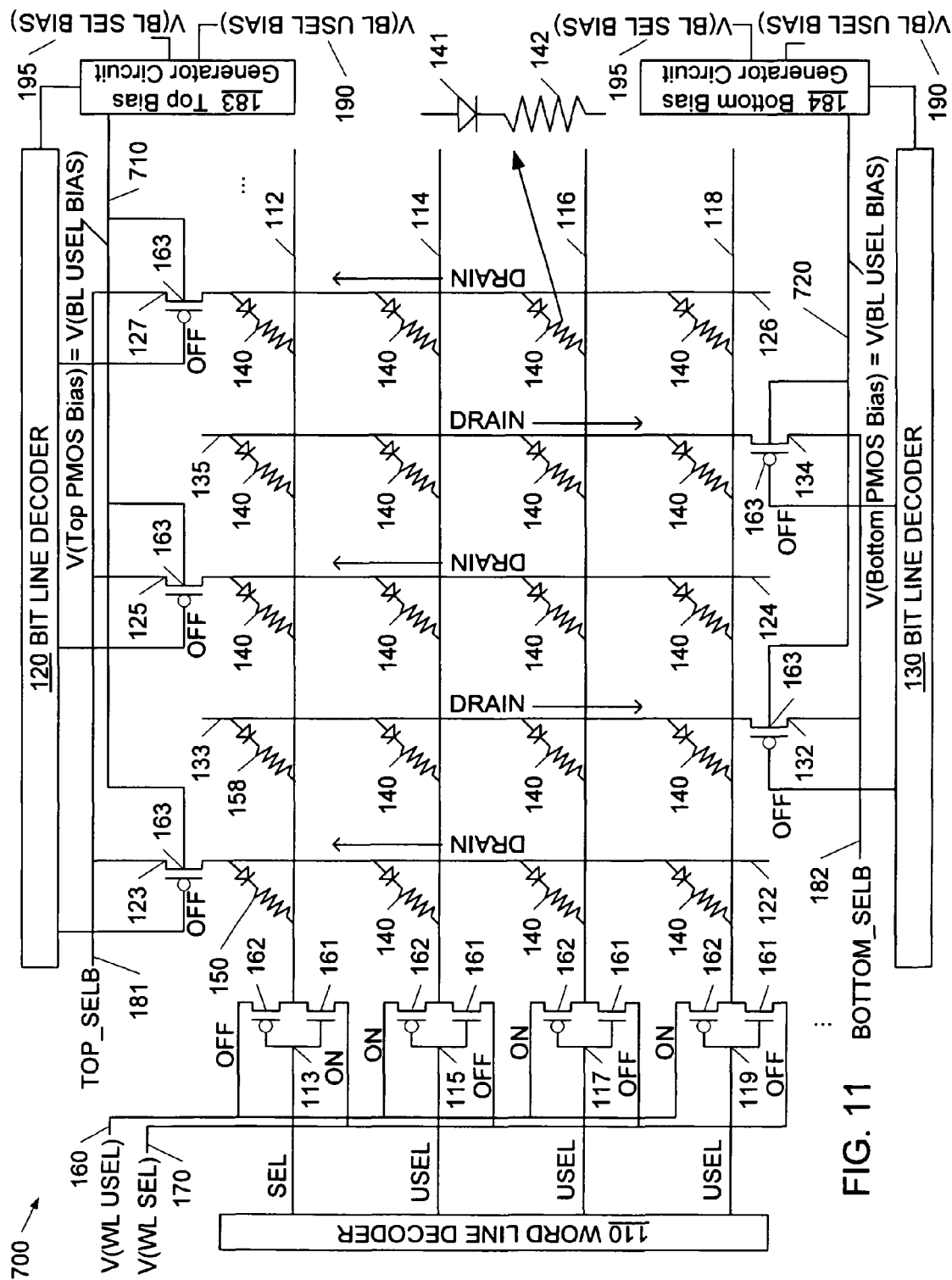
FIG. 11 is a diagram of the memory cell array of FIG. 10 where a selected word line is pulled to the word line select voltage in accordance with a representative embodiment.

Referring again to FIG. 2, in an optional operation 220, a selected word line is driven to the word line select voltage. In this example, memory cell 150 is the cell that is targeted for selection, the word line select voltage source is ground and the word line unselect voltage source is about 5 V. Hence, word line 112 is pulled to ground. The remaining word lines are driven to the word line unselect voltage, although the remaining word lines can be driven to the word line unselect voltage at a later point. Referring now to FIG. 11, a diagram of the memory cell array of FIG. 10 where a selected word line is pulled to the word line select voltage in accordance with a representative embodiment is shown. During operation 220, dual device driver 113 is selected and dual device drivers 115, 117 and 119 are unselected. In dual device driver 113 the PMOS transistor 162 is OFF and the NMOS transistor 161 is ON thereby applying the word line select voltage (e.g., ground) to word line 112.

In dual device drivers 115, 117 and 119 the PMOS transistor 162 is ON and the NMOS transistor 161 is OFF thereby applying the word line unselect voltage (e.g., 5 V) to word lines 114, 116 and 118, respectively. During operation 220, the top bit lines 122, 124 and 126 and the bottom bit lines 133 and 135 can continue to drain through the top single device drivers 123, 125 and 127 and the bottom single device drivers 132 and 134, respectively. Operation 220 can be skipped, for example, if a word line is previously selected or does not need to be selected for an associated operation.

Figure 12:
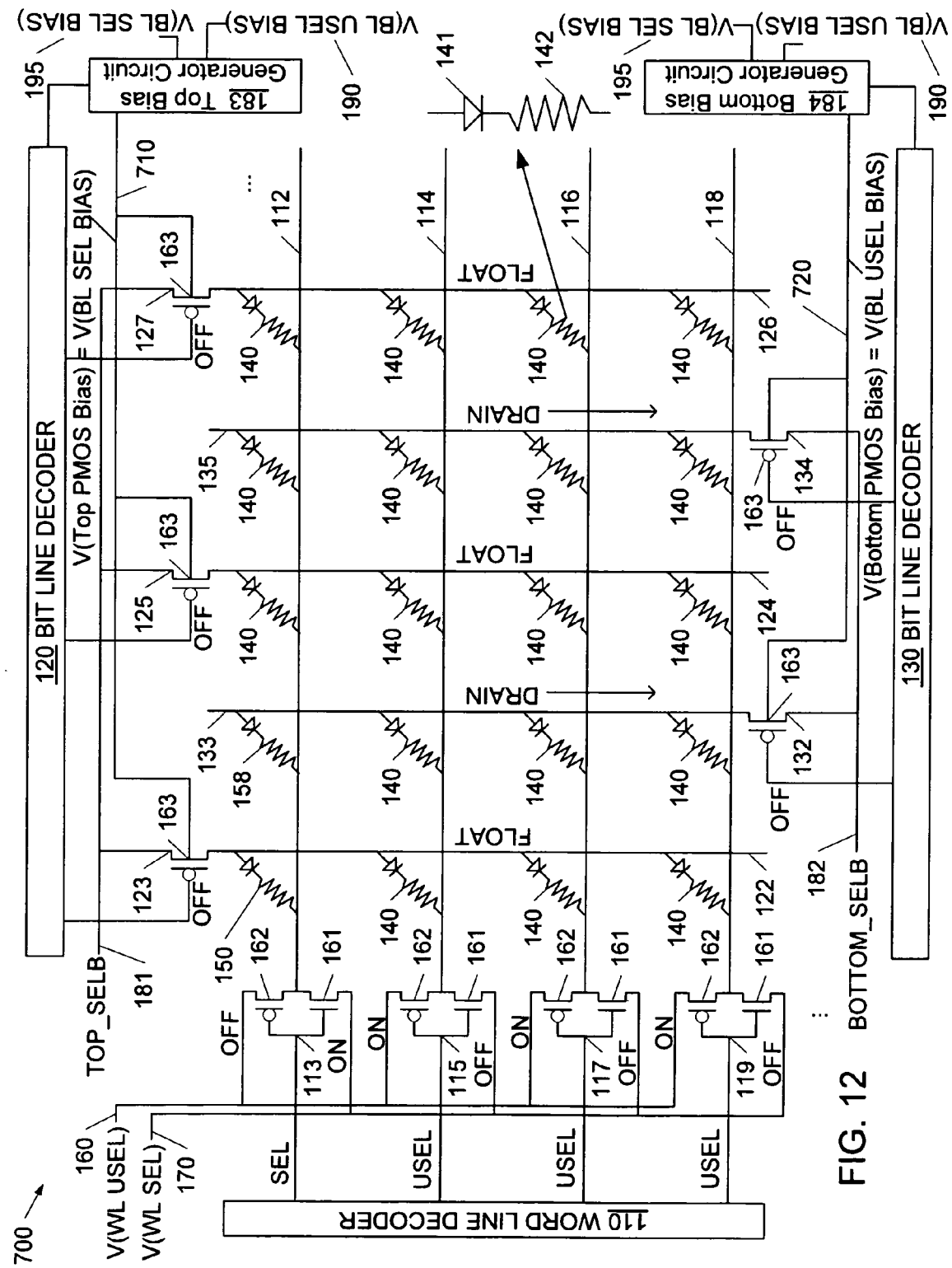
FIG. 12 is a diagram of the memory cell array of FIG. 11 where the top bit lines are floated in accordance with a representative embodiment.

Referring again to FIG. 2, in an optional operation 230, the top bit lines 122, 124 and 126 are floated. The floating occurs for a time period while the top bias generator circuit 183 changes the top PMOS bias 710 (V(Top PMOS Bias)) from the bit line unselect biasing voltage to the bit line select biasing voltage. In this example, the bit line select biasing voltage is about Vpp or 5 V. Referring now to FIG. 12, a diagram of the memory cell array of FIG. 11 where the top bit lines are floated in accordance with a representative embodiment is shown. During operation 230, the gates of the PMOS transistors in the top single device drivers 123, 125 and 127 turned OFF and the top bias generator circuit 183 drives the top PMOS bias 710 to the bit line select biasing voltage (e.g., 5 V). Consequently, the top bit lines 122, 124 and 126 float. Alternatively, the bottom bit lines 133 and 135 can also be floated. Alternatively, the gates of the PMOS transistors in the top single device drivers 123, 125 and 127 can also be ON during the float depending on the status of TOP_SELB. Operation 230 can be skipped, for example, if the transition of the top PMOS bias from the bit line unselect biasing voltage to the bit line select biasing voltage can be synchronized with selecting a bit line.

Figure 13:
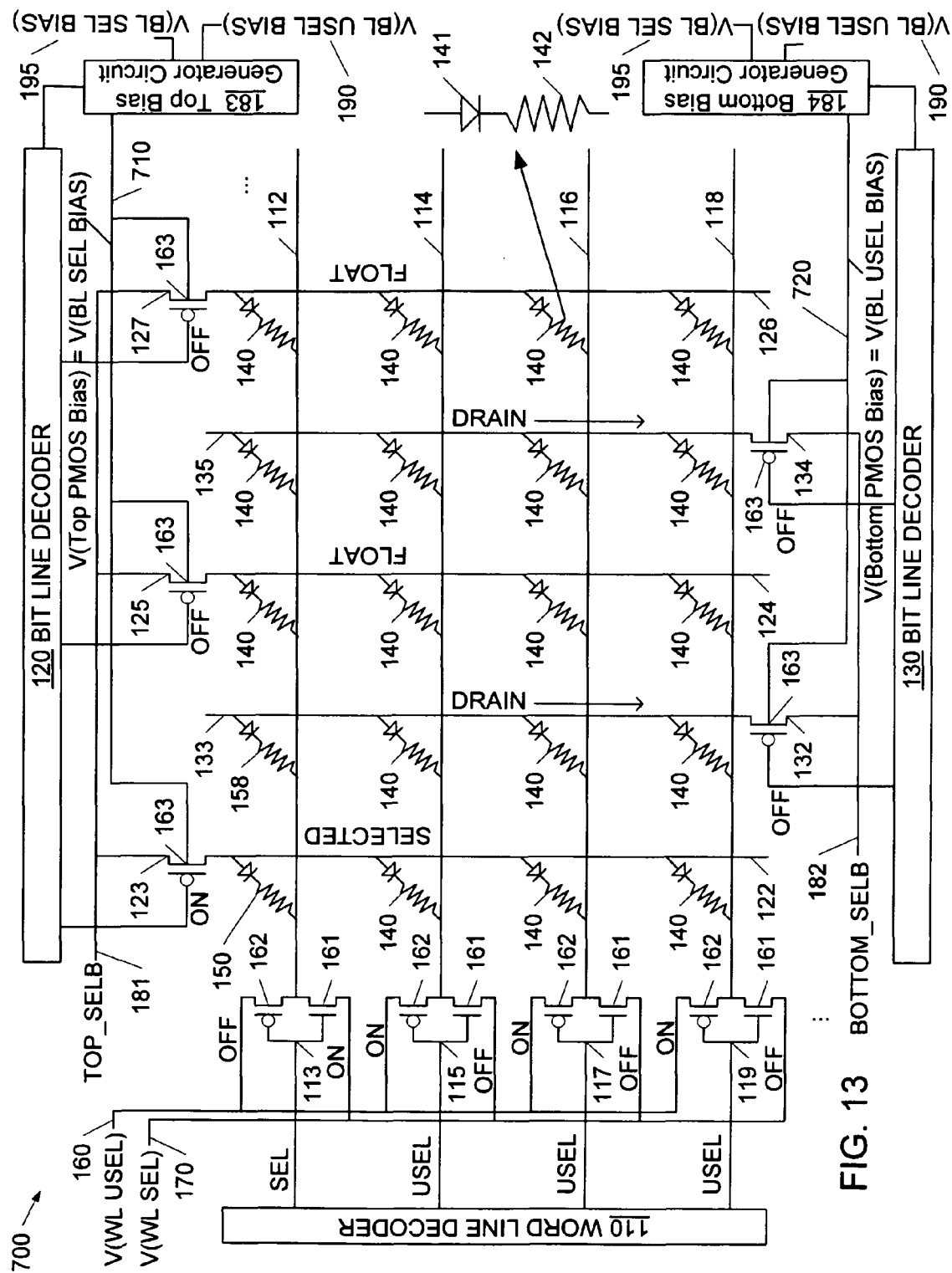
FIG. 13 is a diagram of the memory cell array of FIG. 12 where a selected bit line is driven to the bit line select voltage a first time in accordance with a representative embodiment.

Referring again to FIG. 2, in an operation 240, a selected bit line is driven to the bit line select voltage. As before, memory cell 150 is the cell that is targeted for selection. In this example, the bit line select voltage is about 5 V. Hence, bit line 122 is driven to about 5 V via TOP_SELB. The remaining top bit lines 124 and 126 continue to float, and the bottom bit lines 133 and 135 can continue to drain. Referring now to FIG. 13, a diagram of the memory cell array of FIG. 12 where a selected bit line is driven to the bit line select voltage a first time in accordance with a representative embodiment is shown. During operation 240, the top select bus 181 (TOP_SELB) is driven to the bit line select voltage. The top bias generator circuit 183 drives the top PMOS bias 710 (V(Top PMOS Bias)) to the bit line select biasing voltage. The top single device driver 123 is selected while the remaining top single device drivers 125 and 127 are deselected. Specifically, in top single device driver 123 the PMOS transistor is ON thereby applying the bit line select voltage (e.g., 5 V) to top bit line 122 via the top select bus 181 (TOP_SELB). In top single device drivers 125 and 127 the PMOS transistor is OFF. The bottom single device drivers 132 and 134 continue to drain. Charge continues to drain from the bottom bit lines and the bottom bit lines remain in a partially floating state. Optionally, at this point, the selected cell(s) can be read or written.

Referring again to FIG. 2, in an optional operation 250, the top bit lines 122, 124 and 126 and the bottom bit lines 133 and 135 are pulled to the bit line unselect voltage. As in FIG. 10, the top bias generator circuit 183 provides the bit line biasing unselect voltage to the top PMOS bias 710. The bottom bias generator circuit 184 provides the bit line unselect biasing voltage to the bottom PMOS bias 720. The gates of the PMOS transistors in the top single device drivers 123, 125 and 127 and the bottom single device drivers 132 and 134 are turned OFF. Consequently, the top bit lines 122, 124 and 126 and the bottom bit lines 133 and 135 are pulled to the bit line unselect voltage through the well diodes of the top single device drivers 123, 125 and 127 and the well diodes of the bottom single device drivers 132 and 134, respectively. Thus, charge is drained from the bit lines and the bit lines enter a partially floating state. However, the selected word line can be held at the word line select voltage and the remaining word lines can be held at the word line unselect voltage.

Referring again to FIG. 2, in an optional operation 260, the selected bit line is driven to the bit line select voltage a second time. Referring again to FIG. 13, the top select bus 181 (TOP_SELB) is driven to the bit line select voltage. The top bias generator circuit 183 drives the top PMOS bias 710 (V(Top PMOS Bias)) to the bit line select biasing voltage. The top single device driver 123 is selected while the remaining top single device drivers 125 and 127 float. Specifically, in top single device driver 123 the PMOS transistor is ON thereby applying the bit line select voltage (e.g., 5 V) to top bit line 122 via the top select bus 181 (TOP_SELB). In top single device drivers 125 and 127 the PMOS transistor is OFF. The bottom single device drivers 132 and 134 continue to drain the bottom bit lines 133 and 135. The bottom bit lines 133 and 135 remain in a partially floating state. The selected word line can be held at the word line select voltage and the remaining word lines can be held at the word line unselect voltage.

Referring again to FIG. 2, in an operation 270, the selected memory cell 150 is now biased so that its diode conducts and the memory cell array 700 has been substantially discharged. A write circuit is electrically connected to the selected memory cell 150 through the word line decoder 110 and the top bit line decoder 120. Accordingly, the write circuit applies a current to the selected memory cell 150 and writes its state. Alternatively, the selected memory cell 150 can be read. The discharging cycle described above can be performed periodically or every time that a new memory cell is selected for a read or write as described above.

In an operation 280, a different bit line can be selected such as bottom bit line 133. Bit line 122 is unselected. A new selected memory cell 158 is now selected and biased.

In an operation 290, the new selected memory cell 158 is now properly biased so that its diode conducts and the memory cell array 700 has been substantially discharged. A current sensing circuit is electrically connected to the selected memory cell 158 through the word line decoder 110 and the top bit line decoder 120. Accordingly, the current sensing circuit applies a current to the selected memory cell 158 and determines its state. Alternatively, the selected memory cell 158 can be programmed. Alternatively, multiple cells can be selected at once or in immediate succession. Advantageously, the memory cell array 700 can be read and programmed using lower voltages and currents.

Figure 14:
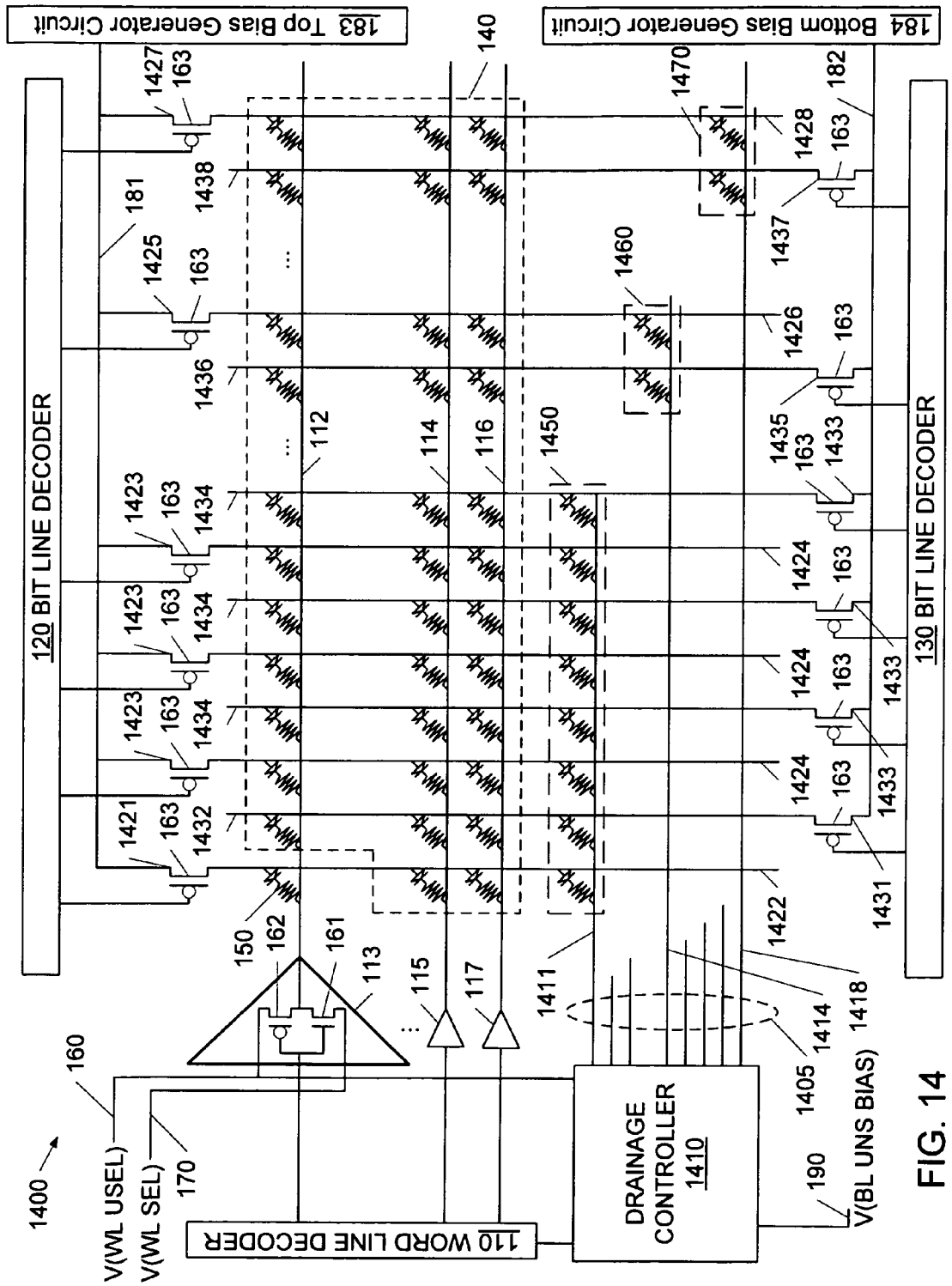
FIG. 14 is a diagram of a memory cell array with drainage lines, a single device bit line driver and a dual device word line driver in accordance with a representative embodiment.

Memory Cell Array with a Single Device Bit Line Driver and a Dual Device Word Line Driver Including Drainage Word Lines In another representative embodiment, special drainage word lines can also be used to drain the charge out of the bit lines. Referring to FIG. 14, a diagram of a memory cell array 1400 with drainage lines, a single device bit line driver and a dual device word line driver in accordance with a representative embodiment is shown. In a representative embodiment, memory cell array 1400 includes the circuit of FIG. 1. The memory cell array 1400 includes a word line (i.e., row) decoder 110, a top bit line (i.e., column) decoder 120, a bottom bit line (i.e., column) decoder 130, word lines 112, 114, and 116, top bit lines (i.e., connected to top bit line decoder 120) 1422, 1424, 1426 and 1428, bottom bit lines (i.e., connected to bottom bit line decoder 130) 1432, 1434, 1436 and 1438, and memory cells 140 and 150. The memory cell array 1400 also includes a drainage controller 1410 and drainage lines 1405. Each of the memory cells 140 and 150 is connected to one bit line (for instance, memory cell 150 is connected to top bit line 1422) and one word line (for instance, memory cell 150 is connected to word line 112). Each of the memory cells 140 and 150 include a current steering element and a resistivity switching storage element. The current steering element can be, for example, a diode including a p-n semiconductor diode, a p-i-n semiconductor diode, a metal insulator metal (MIM) diode, or a metal insulator-insulator metal (MIIM) diode. The current steering element can be designed to operate using various operating switching voltages, for example, 1.5 V, 2 V, 3 V, 5 V, or 12 V. The resistivity switching storage element can be, for example, a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material. The resistivity switching storage element can be a single state or multi-state one-time-programmable or re-writable cell. Thus, preferably, each memory cell is a two terminal memory cell.

The word line decoder 110 controls dual device drivers 113, 115 and 117. Each of the dual device drivers 113, 115 and 117 drives one of the word lines 112, 114, and 116, respectively. Each of the dual device drivers 113, 115 and 117 includes a PMOS transistor 162 and a NMOS transistor 161. In this example, the NMOS transistor 161 is connected (e.g., the source region of the NMOS is connected) to a word line select voltage source 170 (V(WL SEL)). The word line select voltage source 170 provides a word line select voltage of about −0.5 V to 0.5 V. The word line select voltage source 170 can also be ground. The PMOS transistor 162 is connected (e.g., the source region of the PMOS is connected) to a word line unselect voltage source 160 (V(WL USEL)). The memory cell array 1400 has a main supply voltage Vpp. The word line unselect voltage source 160 provides a word line unselect voltage equal to about Vpp. The word line unselect voltage source 160 is about 1 V to 12 V. Hence, when the word line decoder 110 applies a select control voltage to the dual device driver 113 the NMOS transistor 161 is activated and applies (e.g., via the NMOS drain) the word line select voltage to the word line 112; the PMOS transistor 162 is deactivated. Conversely, the when the word line decoder 110 applies an unselect control voltage to the dual device drivers 115 and 117, the PMOS transistor 162 is activated (e.g., the word line unselect voltage source 160 is applied to the PMOS source) and applies the word line unselect voltage to the word lines 114 and 116; the NMOS transistor 161 is deactivated.

The top bit line decoder 120 controls top single device drivers 1421, 1423, 1425 and 1427. Each of the top single device drivers 1421, 1423, 1425 and 1427 drives one of the top bit lines 1422, 1424, 1426 and 1428, respectively. The bottom bit line decoder 120 controls bottom single device drivers 1431, 1433, 1435 and 1437. Each of the bottom single device drivers 1431, 1433, 1435 and 1437 drives one of the bottom bit lines 1432, 1434, 1436 and 1438, respectively. Each of the top single device drivers 1421, 1423, 1425 and 1427 and bottom single device drivers 1431, 1433, 1435 and 1437 includes a PMOS transistor 163.

The top single device drivers 1421, 1423, 1425 and 1427 can be connected to a top bias generator circuit 183 by top select bus 181. The top bias generator circuit 183 can be connected to a bit line select voltage source and a bit line unselect voltage source. The bit line select voltage is equal to about Vpp. The bit line select voltage is about 1 V to 12 V. The bit line unselect voltage is about −1 V to 1 V. The bit line unselect voltage is equal to about the word line select voltage. Thus, the top bias generator circuit 183 can provide either the bit line select voltage source or the bit line unselect voltage source to the top select bus 181.

The bottom single device drivers 1431, 1433, 1435 and 1437 can be connected to a bottom bias generator circuit 184 by bottom select bus 182. The bottom bias generator circuit 184 can be connected to the bit line select voltage source and the bit line unselect voltage source. Thus, the bottom bias generator circuit 184 can provide either the bit line select voltage source or the bit line unselect voltage source to the bottom select bus 182. Alternatively, the bit line select voltage sources for the top and bottom can be provided separately.

The top bit lines 1422, 1424, 1426 and 1428 are interleaved with the bottom bit lines 1432, 1434, 1436 and 1438. The top single device drivers 1421, 1423, 1425 and 1427 and bottom single device drivers 1431, 1433, 1435 and 1437 are on opposite sides of the array. Hence the coupling capacitance from a selected bit line is always to interleaved bit lines that are driven from the opposite side of the array.

The drainage controller 1410 and the drainage lines 1405 are electrically coupled to the bit lines (top bit lines 1422, 1424, 1426 and 1428 and bottom bit lines 1432, 1434, 1436 and 1438) by drainage cells 1450, 1460 and 1470. The drainage controller 1410 communicates with the word line decoder 110, the top bit line decoder 120 and the bottom bit line decoder 130 so the drainage controller 1410 can determine which of the drainage lines 1405 to activate and when. The drainage cells 1450, 1460 and 1470 can be physically identical to the memory cells 140 and 150. Alternatively, the drainage cells 1450, 1460 and 1470 can be specially constructed for the purpose of drainage, for example, a drainage cell could just be a diode without a resistivity storage element.

Each of the drainage lines 1405 is coupled to a group of bit lines. Preferably, the bit lines in a group are contiguous on and/or across memory levels; however, the bit lines in a group may be spread out. In one example, the bit lines are divided into eight groups, however, any number of groups is possible. In FIG. 14, three groups of an eight group memory cell array are depicted. A group one drainage line 1411 is electrically coupled to bit lines 1422, 1424, 1432 and 1434 by group one drainage cells 1450. The group one drainage cells 1450 are permanently set to a low resistivity state. A group four drainage line 1414 is electrically coupled to bit lines 1426 and 1436 by group four drainage cells 1460. The group four drainage cells 1460 are permanently set to a low resistivity state. A group eight drainage line 1418 is electrically coupled to bit lines 1428 and 1438 by group eight drainage cells 1470. The group eight drainage cells 1470 are permanently set to a low resistivity state. In other words, every drainage line is electrically to some but not all bit lines via drainage cells. Preferably, the drainage groups are mutually exclusive; however, the groups can overlap or be interlaced. Alternatively, the "empty" bit line word line crossover spaces may also include cells that are set to the high resistivity state or have an integrated fuse blown.

The drainage controller 1410 can apply either a blocking voltage such as the word line unselect voltage or a bit line unselect biasing voltage 190 (V(BL UNS BIAS)) to the drainage lines. The bit line unselect biasing voltage is preferably equal to about the desired bit line unselect voltage less a threshold voltage of a drainage cell. The bit line unselect biasing voltage source 190 pulls the bit lines to about −1 V to 1 V through drainage cells connected to a drainage line. The threshold voltage Vt is the effective turn-on voltage of the diode element in a drainage cell. When any of the drainage lines 1405 is held at the bit line unselect biasing voltage, any charge with a potential of greater than the bit line unselect biasing voltage plus the threshold voltage Vt that is on the respective bit lines will leak through the drainage cells to the drainage line.

Alternatively, the orientation of the memory cells 140 and 150 and be reversed so their "anode" and "cathode" are interchanged. The PMOS transistors are replaced with NMOS transistors and vice-versa. Hence, the select and unselect voltages are reversed in polarity. Alternatively, the top single device drivers, the bottom single device drivers, and the dual device drivers can optionally include pull-up or pull-down resistors.

Figure 15:
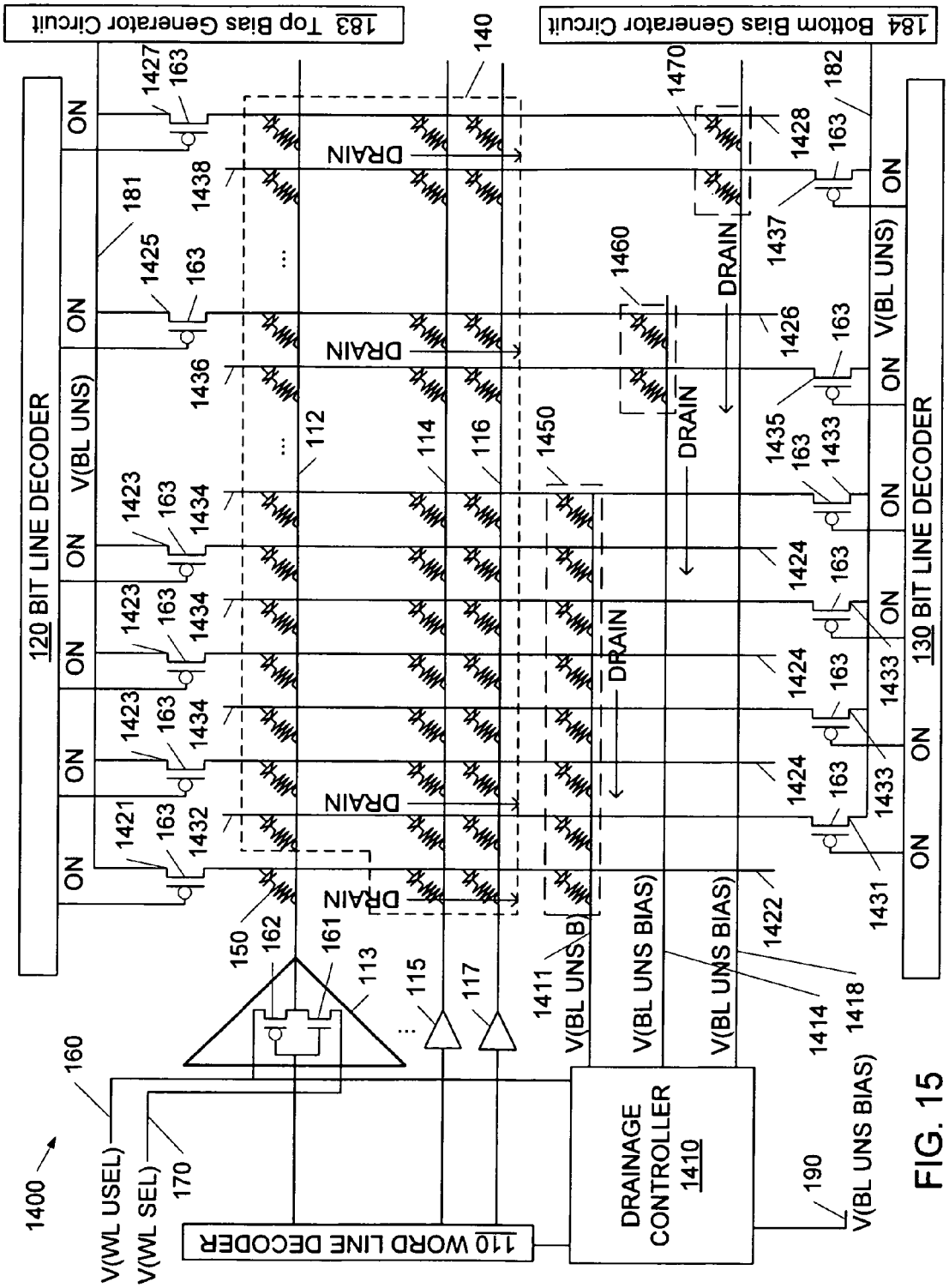
FIG. 15 is a diagram of the memory cell array of FIG. 14 where the bit lines are pulled to the bit line unselect voltage in accordance with a representative embodiment.

Referring to again FIG. 2, the discharge sequence is applied to a memory cell array with special drainage lines. In an operation 210, the, the top bit lines 1422, 1424, 1426 and 1428 and the bottom bit lines 1432, 1434, 1436 and 1438 are pulled to the bit line unselect voltage. In this example, the bit line unselect voltage is about 0.7 V. Referring now to FIG. 15, a diagram of the memory cell array of FIG. 14 where the bit lines are pulled to the bit line unselect voltage in accordance with a representative embodiment is shown. During operation 210, the top bias generator circuit 183 provides the bit line unselect voltage to the top select bus 181. The bottom bias generator circuit 184 provides the bit line unselect voltage to the bottom select bus 182. The gates of the PMOS transistors in the top single device drivers 1421, 1423, 1425 and 1427 and the bottom single device drivers 1431, 1433, 1435 and 1437 are turned ON. Consequently, the top bit lines 1422, 1424, 1426 and 1428 and the bottom bit lines 1432, 1434, 1436 and 1438 are pulled to the bit line unselect voltage through the top single device drivers 1421, 1423, 1425 and 1427 and the bottom single device drivers 1431, 1433, 1435 and 1437, respectively.

Additionally, the drainage controller 1410 pulls all of the drainage lines to the bit line unselect biasing voltage via the bit line unselect biasing voltage 190 (V(BL UNS BIAS)). For example, as depicted, the group one drainage line 1411, the group four drainage line 1414, and the group eight drainage line 1418 are pulled to the bit line unselect biasing voltage by the drainage controller 1410. Since the bit line unselect biasing voltage is Vt less than the bit line unselect voltage, the bit lines should be pulled to the bit line unselect voltage. Hence, there are multiple path for draining the bit lines.

Figure 16:
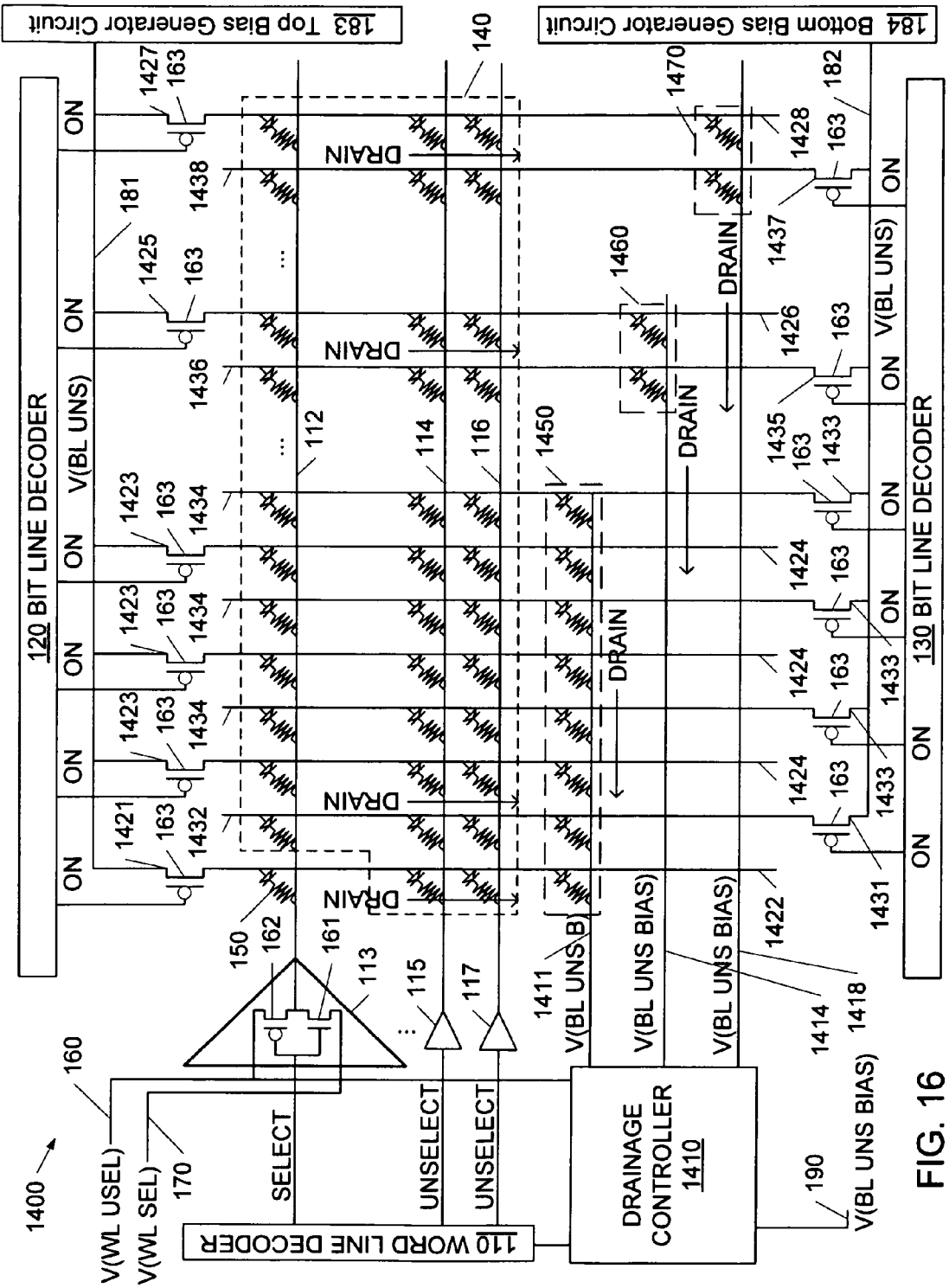
FIG. 16 is a diagram of the memory cell array of FIG. 15 where a selected word line is pulled to the word line select voltage in accordance with a representative embodiment.

Referring again to FIG. 2, in an optional operation 220, a selected word line is driven to the word line select voltage. In this example, memory cell 150 is the cell that is targeted for selection, the word line select voltage source is ground and the word line unselect voltage source is about 5 V. Hence, word line 112 is pulled to ground. The remaining word lines are driven to the word line unselect voltage, although the remaining word lines can be driven to the word line unselect voltage at a later point. Referring now to FIG. 16, a diagram of the memory cell array of FIG. 15 where a selected word line is pulled to the word line select voltage in accordance with a representative embodiment is shown. During operation 220, dual device driver 113 is selected and dual device drivers 115 and 117 are unselected. In dual device driver 113 the PMOS transistor 162 is OFF and the NMOS transistor 161 is ON thereby applying the word line select voltage (e.g., ground) to word line 112.

In dual device drivers 115 and 117 the PMOS transistor is ON and the NMOS transistor is OFF thereby applying the word line unselect voltage (e.g., 5 V) to word lines 114 and 116, respectively. During operation 220, the top bit lines 1422, 1424, 1426 and 1428 and the bottom bit lines 1432, 1434, 1436 and 1438 can continue to drain through the top single device drivers 1421, 1423, 1425 and 1427 and the bottom single device drivers 1431, 1433, 1435 and 1437, respectively. Operation 220 can be skipped, for example, if a word line is previously selected or does not need to be selected for an associated operation.

Figure 17:
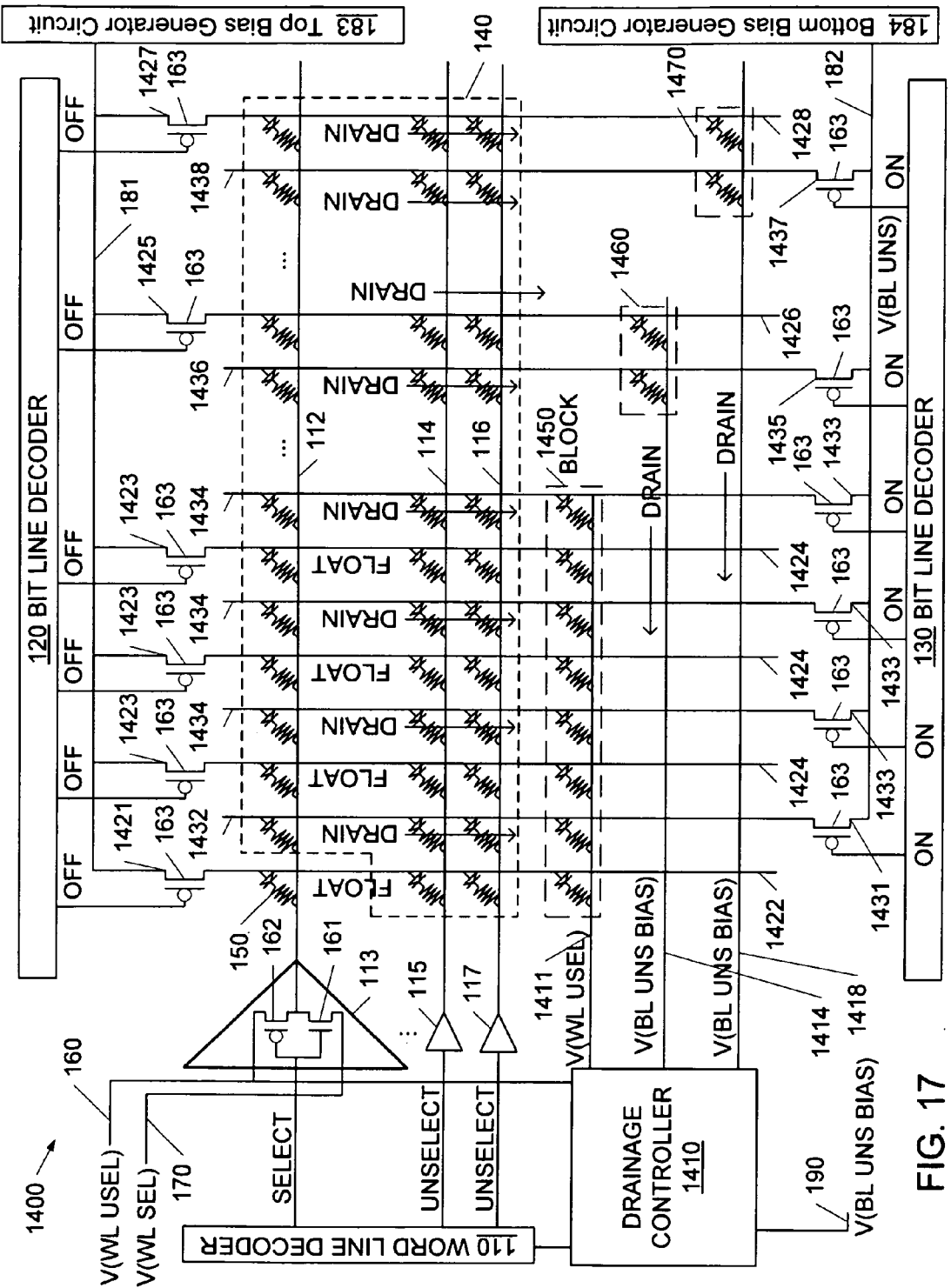
FIG. 17 is a diagram of the memory cell array of FIG. 16 where the top bit lines are floated in accordance with a representative embodiment.

Referring again to FIG. 2, in an optional operation 230, the top bit lines 1422 and 1424 are floated and the drainage line associated with a bit line to be selected is blocked. The floating allows a time period for the top bias generator circuit 183 to change the top select bus 181 from the bit line unselect voltage to the bit line select voltage and for the drainage controller 1410 to block the drainage path to a drainage line associated with the bit line to be selected. Referring now to FIG. 17, a diagram of the memory cell array of FIG. 16 where the top bit lines are floated in accordance with a representative embodiment is shown. During operation 230, the gates of the PMOS transistors in top single device drivers 1421, 1423, 1425 and 1427 are turned OFF. Since memory cell 150, the cell to be selected, is connected to bit line 1422, group one is the group associated with the selected cell and the group one drainage line 1411 is blocked. The drainage controller 1410 drives the group one drainage line 1411 to the word line unselect voltage thereby un-biasing the group one drainage cells 1450. Consequently, the top bit lines 1422 and 1424 float. Alternatively, the remaining top bit lines 1426 and 1428 and the bottom bit lines 1432, 1434, 1436 and 1438 can also be floated. Alternatively, the drainage controller 1410 can continue to drain all or some of the drainage groups. Operation 230 can be skipped, for example, if the transition of the top select bus from the bit line unselect voltage to the bit line select voltage and blocking the associated drainage line can be synchronized with selecting a bit line.

Figure 18:
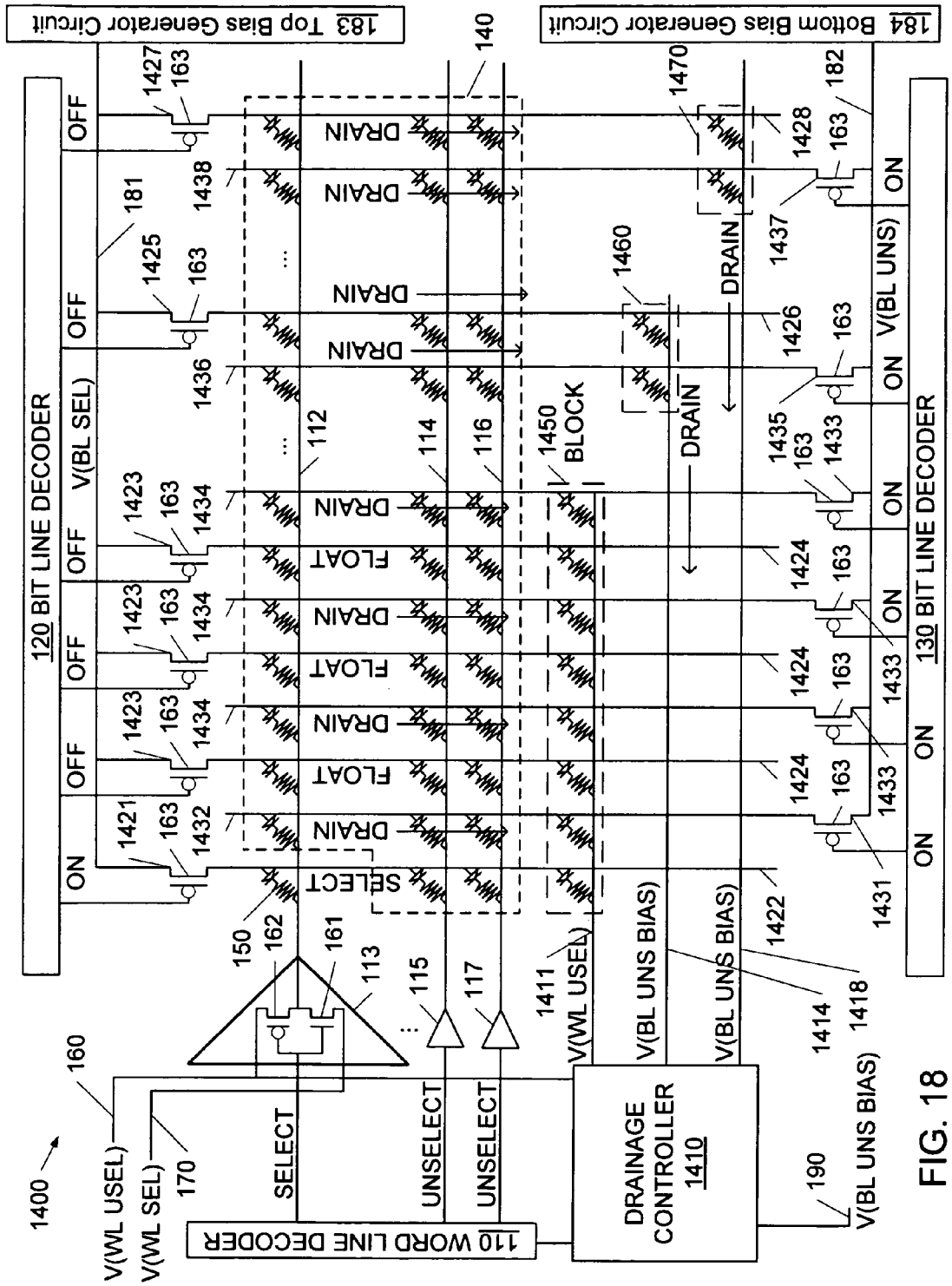
FIG. 18 is a diagram of the memory cell array of FIG. 17 where a selected bit line is driven to the bit line select voltage a first time in accordance with a representative embodiment.

Referring again to FIG. 2, in an operation 240, a selected bit line is driven to the bit line select voltage. Referring now to FIG. 18, a diagram of the memory cell array of FIG. 17 where a selected bit line is driven to the bit line select voltage a first time in accordance with a representative embodiment is shown. During operation 240, the top bias generator circuit 183 provides the bit line select voltage to the top select bus 181. As before, memory cell 150 is the cell that is targeted for selection. In this example, the bit line select voltage is about 5 V. The top single device driver 1421 is selected while the remaining top single device drivers 1423, 1425 and 1427 are unselected. Hence, bit line 1422 is driven to about 5 V. The remaining group one top bit lines 1424 continue to float. The remaining top bit lines 1426 and 1428 and the bottom bit lines 1432, 1434, 1436 and 1438 can continue to drain. The top bit lines 1426 and 1428 drain through the group four drainage line 1414 and the group eight drainage line 1418, respectively. The bottom bit lines 1432, 1434, 1436 and 1438 drain through the bottom single device drivers 1431, 1433, 1435 and 1437. The bottom bit lines 1436 and 1438 also drain through the group four drainage line 1414 and the group eight drainage line 1418, respectively. Without the group four drainage line 1414 and the group eight drainage line 1418, top bit lines 1426 and 1428 would have had to also float. Advantageously, the drainage lines increase the number of bit lines that are able to be drained while a bit line is selected. Optionally, at this point, the selected cell(s) can be read, written, etc.

Referring again to FIG. 2, in an optional operation 250, the top bit lines 1422, 1424, 1426 and 1428 and the bottom bit lines 1432, 1434, 1436 and 1438 are pulled to the bit line unselect voltage. As in FIG. 15, the top bias generator circuit 183 provides the bit line unselect voltage to the top select bus 181. The bottom bias generator circuit 184 provides the bit line unselect voltage to the bottom select bus 182. The gates of the PMOS transistors in the top single device drivers 1421, 1423, 1425 and 1427 and the bottom single device drivers 1431, 1433, 1435 and 1437 are turned ON. Consequently, the top bit lines 1422, 1424, 1426- and 1428 and the bottom bit lines 1432, 1434, 1436 and 1438 are pulled to the bit line unselect voltage through the top single device drivers 1421, 1423, 1425 and 1427 and the bottom single device drivers 1431, 1433, 1435 and 1437, respectively. However, the selected word line can be held at the word line select voltage and the remaining word lines can be held at the word line unselect voltage.

Referring again to FIG. 2, in an optional operation 260, the selected bit line is driven to the bit line select voltage a second time. As in FIG. 18, the top bias generator circuit 183 provides the bit line select voltage to the top select bus 181. As before, memory cell 150 is the cell that is targeted for selection. In this example, the bit line select voltage is about 5 V. The top single device driver 1421 is selected while the remaining top single device drivers 1423, 1425 and 1427 are unselected. Hence, bit line 1422 is driven to about 5 V. The remaining group one top bit lines 1424 continue to float. The remaining top bit lines 1426 and 1428 and the bottom bit lines 1432, 1434, 1436 and 1438 can continue to drain. The top bit lines 1426 and 1428 drain through the group four drainage line 1414 and the group eight drainage line 1418, respectively. The bottom bit lines 1432, 1434, 1436 and 1438 drain through the bottom single device drivers 1431, 1433, 1435 and 1437. The bottom bit lines 1436 and 1438 also drain through the group four drainage line 1414 and the group eight drainage line 1418, respectively. Without the group four drainage line 1414 and the group eight drainage line 1418, top bit lines 1426 and 1428 would have had to also float. Advantageously, the drainage lines increase the number of bit lines that are able to be drained while a bit line is selected. The selected word line can be held at the word line select voltage and the remaining word lines can be held at the word line unselect voltage.

Referring again to FIG. 2, in an operation 270, the selected memory cell 150 is now biased so that its diode conducts and the memory cell array 1400 has been substantially discharged. A write circuit is electrically connected to the selected memory cell 150 through the word line decoder 110 and the top bit line decoder 120. Accordingly, the write circuit applies a current to the selected memory cell 150 and writes its state. Alternatively, the selected memory cell 150 can be read. The discharging cycle described above can be performed periodically or every time that a new memory cell is selected for a read or write as described above.

In an operation 280, a different bit line can be selected. A new selected memory cell selected and biased.

In an operation 290, the new selected memory cell is properly biased so that its diode conducts and the memory cell array 1400 has been substantially discharged. A current sensing circuit is electrically connected to the new selected memory cell. Accordingly, the current sensing circuit applies a current to the new selected memory cell and determines its state. Alternatively, the new selected memory cell can be written. Alternatively, multiple cells can be selected at once or in immediate succession. Advantageously, the memory cell array 1400 can be read and written using lower voltages and currents. Although, the memory cell array of FIG. 14 has been described with regard to the circuit of FIG. 1, the drainage lines can be added to any memory array, including, for example, the circuit of FIG. 7.

Figure 19:
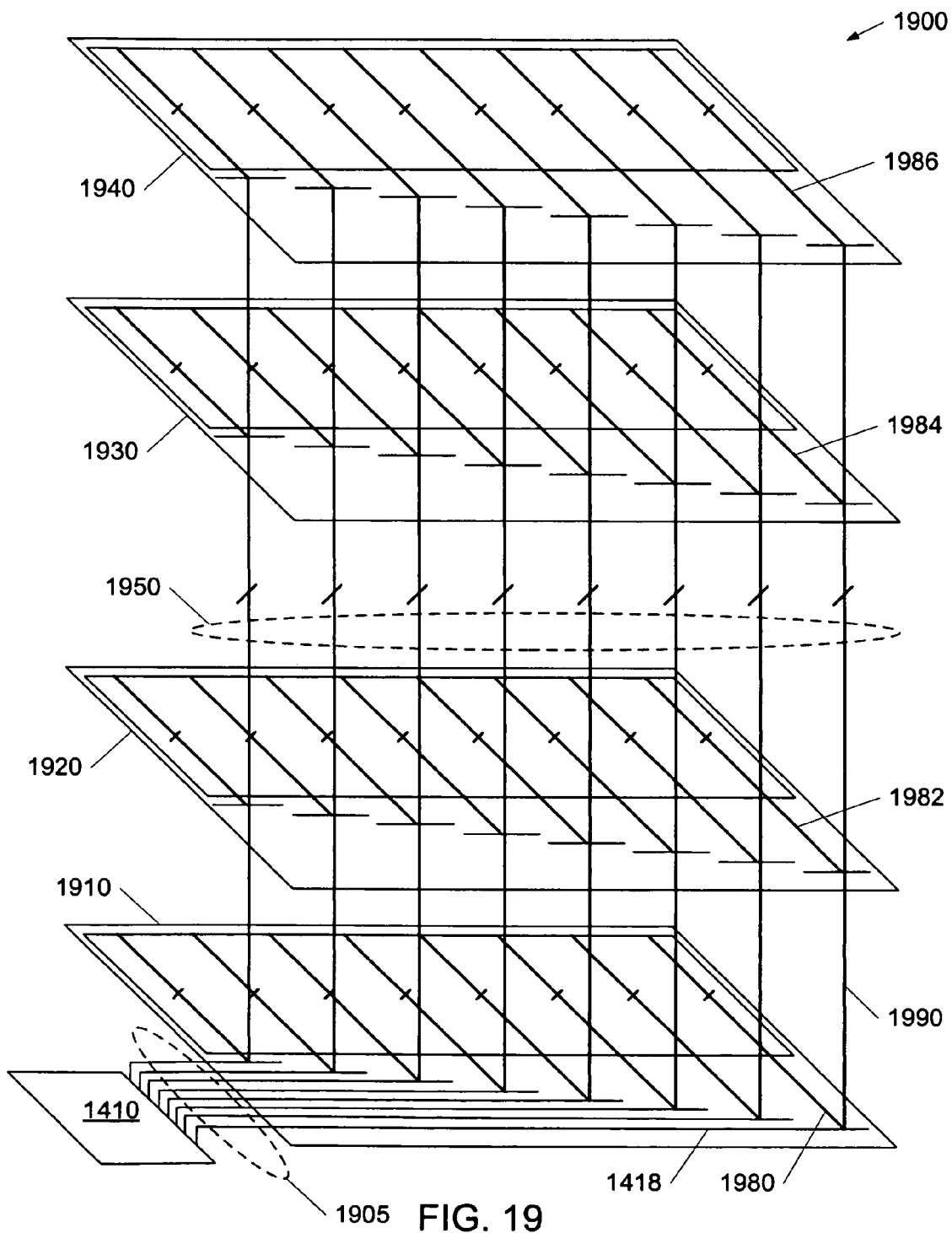
FIG. 19 is a diagram of a three-dimensional memory cell array, such as a monolithic 3D array, in accordance with a representative embodiment.

The memory array can also have multiple levels. Referring to FIG. 19, a diagram of a three-dimensional memory cell array 1900, such as a monolithic 3D array, in accordance with a representative embodiment is shown. For example, the three-dimensional memory cell array 1900 includes four memory levels: memory level one 1910, memory level two 1920, memory level three 1930 and memory level four 1940. Each of the memory levels 1910, 1920, 1930 and 1940 include memory cells and their associated bit lines and word lines; however, levels can share bit lines and word lines. One drainage controller 1410 controls the drainage for the three-dimensional memory cell array 1900. The drainage controller 1410 may be located in the semiconductor substrate below the memory level one 1910. The drainage controller 1410 is electrically connected by lines 1905 to drainage lines 1980, 1982, 1984, 1986 on each of the memory levels 1910, 1920, 1930 and 1940 by drainage zias 1950. The drainage zias 1950 can be via chains.

Each drainage group is electrically connected amongst the levels. For example, group eight drainage line 1418 is connected to group eight drainage zia 1990. The group eight drainage zia 1990 is electrically connected to group eight, level one drainage lines 1980, group eight, level two drainage lines 1982, group eight, level three drainage lines 1984, and group eight, level four drainage lines 1986. In this example, there are 1024 bit lines on each memory level and each of the bit line groups includes one hundred twenty-eight individual bit lines. The drainage zias 1950 can be placed anywhere along the lines 1905.

Figure 20:
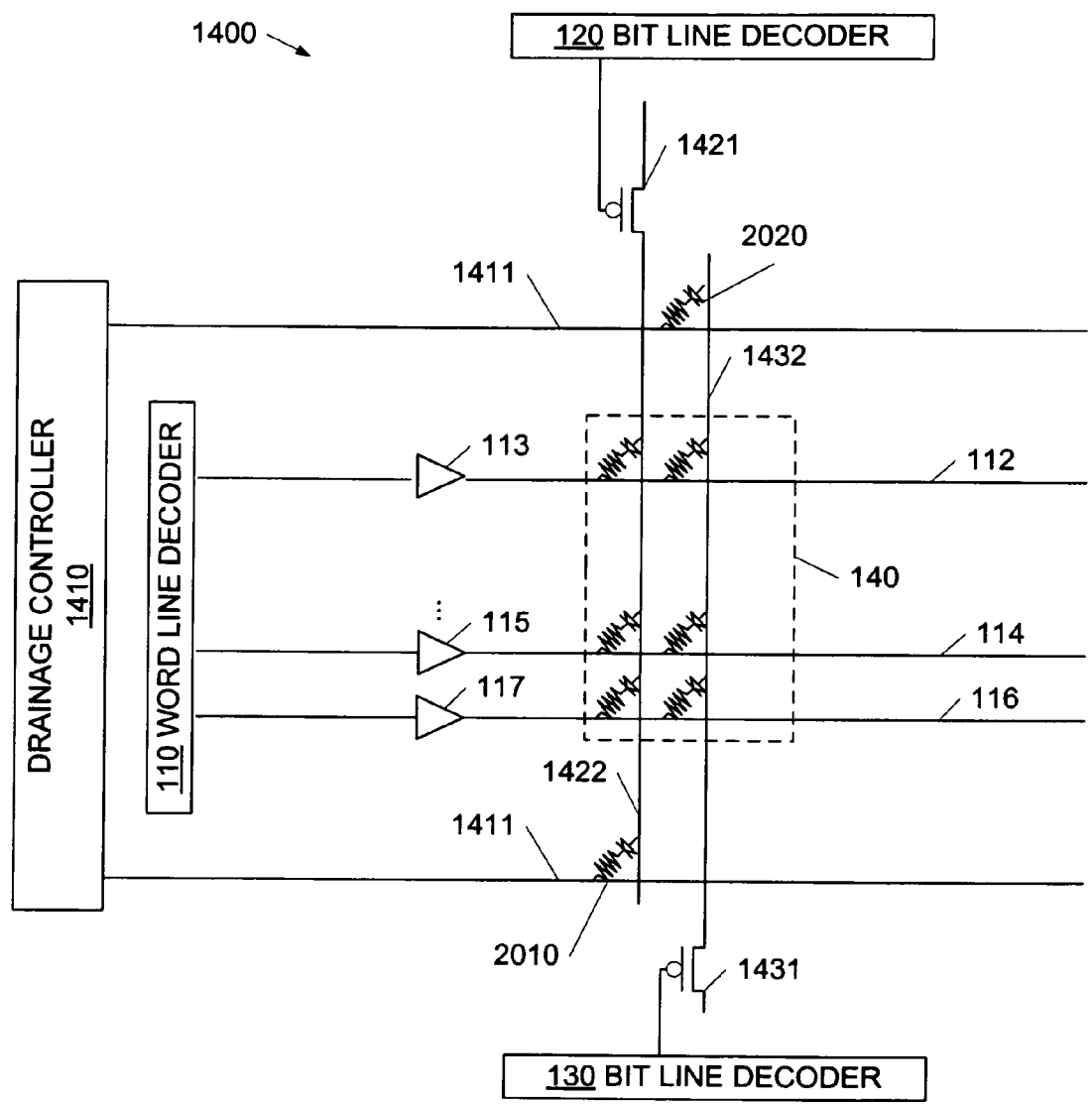
FIG. 20 is a diagram of dual drainage lines in the memory cell array of FIG. 14 in accordance with a representative embodiment.

Drainage lines can also be optimized by locating the electrical connection to the bit line opposite of the bit line drivers. Referring to FIG. 20, a diagram of dual drainage lines in the memory cell array 1400 of FIG. 14 in accordance with a representative embodiment is shown. As before, the memory cell array 1400 includes a word line decoder 110, a top bit line decoder 120, a bottom bit line decoder 130, word lines 112, 114, and 116, top bit line 1422, bottom bit line 1432, and memory cells 140. The memory cell array 1400 also includes a drainage controller 1410 and drainage lines. Only the group one drainage line 1411 is shown.

The word line decoder 110 controls dual device drivers 113, 115 and 117. Each of the dual device drivers 113, 115 and 117 drives one of the word lines 112, 114, and 116, respectively. The top bit line decoder 120 controls top single device driver 1421. The top single device driver 1421 drives the top bit line 1422. The bottom bit line decoder 130 controls bottom single device driver 1431. The bottom single device driver 1431 drives the bottom bit line 1432. The top bit line 1422 is interleaved with the bottom bit line 1432. The top single device driver 1421 and the bottom single device driver 1431 are on opposite sides of the array.

The drainage controller 1410 and the drainage line 1411 are electrically coupled to bit lines 1422 and 1432 by bottom drainage cell 2010 and top drainage cell 2020, respectively. Drainage line 1411 runs along both the top and bottom of the memory cell array 1400. The drainage line 1411 is connected to its respective group one bit lines by where the connection on a particular side would be farthest away from a bit line's respective driver. For example, bit line 1422 has a top bit line driver 1421; hence bit line 1422 is connected to drainage line 1411 at the bottom of the array by bottom drainage cell 2010. Bit line 1432 has a bottom bit line driver 1431; hence bit line 1432 is connected to drainage line 1411 at the top of the array by top drainage cell 2020. Each of the bit lines in each of the groups would be arranged similarly. Advantageously, the drained leakage current is maximized by draining at the end farthest from the bit line driver.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, the order of fabrication of the layers may be changed without deviating from the spirit of the invention. Likewise, the device and methods of the present invention may be practiced using other passive element memory systems. Additionally, bit lines can be grouped and interleaved in various fashions. For instance, a group could be interlaced within other groups. Additionally, the decoders can be placed or routed from the same side of the array. Additionally, more than two bit line decoders can be used. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n− region by an antifuse element. When the antifuse element is programmed, the p+ region is electrically connected to the n− region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, carbon nanotube layers, which may be formed as described in US Patent Pub 20050269553 Sen, Rahul; et al. which is hereby incorporated by reference, and amorphous, polycrystalline or microcrystalline carbon layers can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. As used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A method of biasing a nonvolatile memory array, the nonvolatile memory array comprising a first plurality of Y lines, a second plurality of Y lines, a plurality of X lines, a first plurality of two terminal memory cells and a second plurality of two terminal memory cells, wherein each of the first plurality of memory cells is coupled to one of the first plurality of Y lines and one of the plurality of X lines and each of the second plurality of memory cells is coupled to one of the second plurality of Y lines and one of the plurality of X lines, the method comprising:
    driving substantially all of the first plurality and second plurality of Y lines to a Y line unselect voltage; and
    driving at least one selected Y line of the first plurality of Y lines to a Y line select voltage while floating remaining Y lines of the first plurality of Y lines and while driving substantially all of the second plurality of Y lines to the Y line unselect voltage.

2. The method of claim 1, further comprising floating substantially all of the first plurality of Y lines before the step of driving at least one selected Y line of the first plurality of Y lines to the Y line select voltage.

3. The method of claim 2, wherein each of the Y lines of the first plurality of Y lines are driven by a respective single device driver, wherein floating substantially all of the first plurality of Y lines comprises unselecting the respective single device drivers.

4. The method of claim 1, further comprising driving at least one selected X line of the plurality of X lines to a X line select voltage.

5. The method of claim 4, further comprising driving substantially all of the plurality of X lines to a X line unselect voltage before driving the at least one selected X line of the plurality of X lines to the X line select voltage.

6. The method of claim 1, further comprising:
    a second driving substantially all of the first plurality of Y lines to a Y line unselect voltage;
    and a second driving the at least one selected Y line of the first plurality of Y lines to the Y line select voltage while floating the remaining Y lines of the first plurality of Y lines.

7. The method of claim 1, wherein the first plurality of Y lines is interleaved with the second plurality of Y lines.

8. The method of claim 1, wherein each of the Y lines of the second plurality of Y lines is driven by a respective single device driver, each single device driver comprising a well diode of a metal oxide semiconductor (MOS) transistor, wherein driving substantially all of the second plurality of Y lines to the Y line unselect voltage comprises pulling the second plurality of Y lines to the Y line unselect voltage through the well diode of the respective single device driver.

9. The method of claim 8, wherein pulling the second plurality of Y lines to the Y line unselect voltage through the well diode of the respective single device driver comprises partially floating the second plurality of Y lines.

10. The method of claim 8, wherein each of the respective single device drivers comprise a gate terminal, wherein pulling the second plurality of Y lines to the Y line unselect voltage through the well diode of the respective single device driver comprises driving the gate terminals to a voltage lower than the Y line unselect voltage.

11. The method of claim 1, wherein the nonvolatile memory array further comprises a plurality of drainage X lines and a plurality of Y line drainage groups, wherein each drainage X line is electrically connected to one of the plurality of Y line drainage groups, and wherein the plurality of Y line drainage groups are comprised from the first plurality and second plurality of Y lines, wherein the step of driving substantially all of the first plurality and second plurality of Y lines to the Y line unselect voltage comprises pulling at least some of the first plurality and second plurality of Y lines to the Y line unselect voltage through the plurality of drainage X lines.

12. The method of claim 11, wherein the step of driving at least one selected Y of the first plurality of Y lines to a Y line select voltage comprises driving a first drainage X line of the plurality of drainage X lines to a blocking voltage, wherein the at least one selected Y line is electrically connected to the first drainage X line.

13. The method of claim 12, wherein the blocking voltage is substantially equal to the X line unselect voltage.

14. The method of claim 5, wherein the Y line unselect voltage comprises a voltage range of about −1 V to 1 V, the Y line select voltage comprises a voltage range of about 1 V to 12 V, the X line select voltage comprises a voltage range of about −0.5 V to 0.5 V, and the X line unselect voltage comprises a voltage range of about 1 V to 12 V.

15. The method of claim 14, wherein the X line select voltage comprises ground.

16. The method of claim 11, wherein each of the plurality of Y line drainage groups is a contiguous group of Y lines.

17. The method of claim 16, wherein the nonvolatile memory array comprises a plurality of memory levels comprising the first and second pluralities of memory cells, and wherein the contiguous group of Y lines comprises Y lines from at least two levels of the plurality of memory levels.

18. The method of claim 11, further comprising not driving the plurality of drainage X lines during a read operation.

19. The method of claim 1, wherein each memory cell comprises:
   a diode comprising a p-n semiconductor diode, a p-i-n semiconductor diode, a metal insulator metal (MIM) diode, or a metal insulator-insulator metal (MIIM) diode;
   and a resistivity switching storage element comprising a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

20. A nonvolatile memory array, comprising:
   a first plurality of Y lines;
   a first plurality of Y line drivers electrically connected to the first plurality of Y lines, wherein each of Y line driver of the first plurality of Y line drivers comprises a single active device;
   a first bias generating circuit electrically connected to a first source of each of the first plurality of Y line drivers, wherein the first bias generating circuit is coupled to a Y line select voltage and a Y line unselect voltage;
   a first decoder that controls the first plurality of Y line drivers;
   a second plurality of Y lines;
   a second plurality of Y line drivers electrically connected to the second plurality of Y lines;
   a second bias generating circuit electrically connected to a second source of each of the second plurality of Y line drivers, wherein the second bias generating circuit is coupled to the Y line select voltage and the Y line unselect voltage;
   a second decoder that controls the second plurality of Y line drivers;
   a plurality of X lines;
   a plurality of X line drivers electrically connected to the plurality of X lines, wherein the plurality of X line drivers comprise a X line select voltage node and a X line unselect voltage node; and
   a plurality of memory cells, wherein each memory cell is a two-terminal memory cell, and wherein each memory cell is electrically connected to one of the either the first or second plurality of Y lines and one of the plurality of X lines.

21. The nonvolatile memory array of claim 20, wherein the first plurality of Y lines are interleaved with the second plurality of Y lines.

22. The nonvolatile memory array of claim 20, wherein the first plurality of Y line drivers is on one side of the plurality of memory cells and the second plurality of Y line drivers is on an opposite side of the plurality of memory cells.

23. The nonvolatile memory array of claim 20, wherein the first decoder selects at least one first Y line driver of the first plurality of Y line drivers, and the first bias generating circuit applies the Y line select voltage to the first source of each of the first plurality of Y line drivers.

24. The nonvolatile memory array of claim 23, wherein the Y lines associated with the remaining Y line drivers of the first plurality of Y line drivers float.

25. The nonvolatile memory array of claim 23, wherein the second decoder selects substantially all of the second plurality of Y line drivers, and the second bias generating circuit applies the Y line unselect voltage to the second source of each of the second plurality of Y line drivers.

26. The nonvolatile memory array of claim 20, wherein the first decoder selects substantially all of the first plurality of Y line drivers, and the first bias generating circuit applies the Y line unselect voltage to the first source of each of the first plurality of Y line drivers, and wherein the second decoder selects substantially all of the second plurality of Y line drivers, and the second bias generating circuit applies the Y line unselect voltage to the second source of each of the second plurality of Y line drivers.

27. The nonvolatile memory array of claim 20, wherein the Y line unselect voltage comprises a voltage in the range of about −1 V to 1 V, the Y line select voltage comprises a voltage in the range of about 1 V to 12 V, the X line select voltage node provides a voltage range of about −0.5 V to 0.5 V, and the X line unselect voltage node provides a voltage range of about 1 V to 12 V.

28. The nonvolatile memory array of claim 20, wherein the single active device is a single metal oxide semiconductor (MOS) transistor.

29. The nonvolatile memory array of claim 20, wherein the plurality of memory cells, the first and second plurality of Y lines, and the plurality of X lines are located in a plurality of memory levels.

30. The nonvolatile memory array of claim 29, wherein at least one of the plurality of X lines is shared between adjacent layers.

31. The nonvolatile memory array of claim 20, wherein each memory cell comprises:
   a diode comprising a p-n semiconductor diode, a p-i-n semiconductor diode, a metal insulator metal (MIM) diode, or a metal insulator-insulator metal (MIIM) diode; and
   a resistivity switching storage element comprising a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

32. A nonvolatile memory array, comprising:
   a first plurality of Y lines;
   a first plurality of Y line drivers electrically connected to the first plurality of Y lines, each of the first plurality of Y line drivers is electrically connected to a Y line select voltage node wherein each Y line driver of the first plurality of Y line drivers comprises a single active device;
   a first bias generating circuit electrically connected to a first body of each of the first plurality of Y line drivers, wherein the first bias generating circuit is coupled to a Y line select biasing voltage and a Y line unselect biasing voltage;
   a first decoder that controls the first plurality of Y line drivers;
   a second plurality of Y lines;
   a second plurality of Y line drivers electrically connected to the second plurality of Y lines, each of the second plurality of Y line drivers is electrically connected to a second Y line select voltage node, wherein each Y line driver of the second plurality of Y line drivers comprises a single active device;

a second bias generating circuit electrically connected to a second body of each of the second plurality of Y line drivers, wherein the second bias generating circuit is coupled to the Y line select biasing voltage and the Y line unselect biasing voltage;

a second decoder that controls the second plurality of Y line drivers;

a plurality of X lines;

a plurality of X line drivers electrically connected to the plurality of X lines, wherein the plurality of X line drivers comprise a X line select voltage node and a X line unselect voltage node; and a plurality of memory cells, wherein each memory cell is a two-terminal memory cell, and wherein each memory cell is electrically connected to one of the either the first or second plurality of Y lines and one of the plurality of X lines.

33. The nonvolatile memory array of claim 32, wherein the first plurality of Y lines are interleaved with the second plurality of Y lines.

34. The nonvolatile memory array of claim 33, wherein the first plurality of Y line drivers is on one side of the plurality of memory cells and the second plurality of Y line drivers is on an opposite side of the plurality of memory cells.

35. The nonvolatile memory array of claim 32, wherein the first decoder selects at least one first Y line driver of the first plurality of Y line drivers, and the first bias generating circuit applies the Y line select biasing voltage to the first body of each of the first plurality of Y line drivers.

36. The nonvolatile memory array of claim 35, wherein the Y lines associated with the remaining Y line drivers of the first plurality of Y line drivers float.

37. The nonvolatile memory array of claim 35, wherein the second bias generating circuit applies the Y line unselect biasing voltage to the second body of each of the second plurality of Y line drivers.

38. The nonvolatile memory array of claim 37, wherein the Y lines associated with the second plurality of Y line drivers partially float.

39. The nonvolatile memory array of claim 32, wherein the first bias generating circuit applies the Y line unselect biasing voltage to the first body of each of the first plurality of Y line drivers, wherein the second bias generating circuit applies the Y line unselect biasing voltage to the second body of each of the second plurality of Y line drivers, and wherein the unselected Y lines associated with the first and second pluralities of Y line drivers partially float.

40. The nonvolatile memory array of claim 32, wherein the Y line unselect biasing voltage comprises a voltage in the range of about −1 V to 1 V, the Y line select voltage node provides a voltage range of about 1 V to 12 V, the second Y line select voltage node provides a voltage range of about 1 V to 12 V, the Y line select biasing voltage comprises a voltage in the range of about 1 V to 12 V, the X line select voltage node provides a voltage range of about −0.5 V to 0.5 V, and the X line unselect voltage node provides a voltage range of about 1 V to 12 V.

41. The nonvolatile memory array of claim 32, wherein the single active device is a single metal oxide semiconductor (MOS) transistor.

42. The nonvolatile memory array of claim 32, wherein the plurality of memory cells, the first and second plurality of Y lines, and the plurality of X lines are located in a plurality of memory levels.

43. The nonvolatile memory array of claim 42, wherein at least one of the plurality of X lines is shared between adjacent layers.

44. The nonvolatile memory array of claim 32, wherein each memory cell comprises:

a diode comprising a p-n semiconductor diode, a p-i-n semiconductor diode, a metal insulator metal (MIM) diode, or a metal insulator-insulator metal (MIIM) diode; and a resistivity switching storage element comprising a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

45. A nonvolatile memory array, comprising:

a plurality of Y lines comprising a plurality of Y line drainage groups;

a plurality of Y line drivers electrically connected to the plurality of Y lines, wherein each of the plurality of Y line drivers provides a Y line select voltage and a Y line unselect voltage;

a decoder that controls the plurality of Y line drivers;

a plurality of X lines;

a plurality of X line drivers electrically connected to the plurality of X lines, wherein the plurality of X line drivers comprise a X line select voltage node and a X line unselect voltage node;

a plurality of memory cells, wherein each memory cell is a two-terminal memory cell, and wherein each memory cell is electrically connected to one of the plurality of Y lines and one of the plurality of X lines; and a plurality of drainage X lines, wherein each of the plurality of drainage X lines is exclusively electrically connected to one respective Y line drainage group of the plurality of Y line drainage groups by a plurality of drainage cells, and each of the plurality of drainage X lines is not electrically connected to remaining Y line drainage groups of the plurality of Y line drainage groups.

46. The nonvolatile memory array of claim 45, wherein a first interleaving group of the plurality of Y lines is interleaved with the remaining plurality of Y lines.

47. The nonvolatile memory array of claim 45, wherein the plurality of memory cells and the plurality of drainage cells have the same structure.

48. The nonvolatile memory array of claim 47, wherein the plurality of drainage cells comprise a steering element and a storage element, and the storage element is permanently set to a low resistivity state.

49. The nonvolatile memory array of claim 45, wherein a first drainage cell of the plurality of drainage cells is electrically coupled to a first Y line of one of the plurality of Y line drainage groups, and wherein the first drainage cell is located near a first end of the first Y line opposite of a second end of the first Y line that is electrically connected to one of the plurality of Y line drivers.

50. The nonvolatile memory array of claim 45, wherein each Y line drainage group of the plurality of Y line drainage groups comprises a contiguous portion of the plurality of Y lines.

51. The nonvolatile memory array of claim 50, wherein the plurality of memory cells, the plurality of Y lines, and the plurality of X lines are located in a plurality of memory levels.

52. The nonvolatile memory array of claim 51, wherein the contiguous portion of the plurality of Y lines comprises Y lines from at least two levels of the plurality of memory levels, and wherein the plurality of drainage X lines are on the same level.

53. The nonvolatile memory array of claim 45, wherein each memory cell comprises:
   a diode comprising a p-n semiconductor diode, a p-i-n semiconductor diode, a metal insulator metal (MIM) diode, or a metal insulator-insulator metal (MIIM) diode;
   and a resistivity switching storage element comprising a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

54. The nonvolatile memory array of claim 46, further comprising:
   a first bias generating circuit electrically connected to each of a first plurality of Y line drivers, associated with the first interleaving group, of the plurality of Y line drivers, wherein the first bias generating circuit is coupled to a Y line select voltage and a Y line unselect voltage; and
   a second bias generating circuit electrically connected to each of a second plurality of Y line drivers, associated with the remaining plurality of Y lines, of the plurality of Y line drivers, wherein the second bias generating circuit is coupled to the Y line select voltage and the Y line unselect voltage.

55. The nonvolatile memory array of claim 46, further comprising:
   a first bias generating circuit electrically connected to a first body of each of a first plurality of Y line drivers, associated with the first interleaving group, of the plurality of Y line drivers, wherein the first bias generating circuit is coupled to a Y line select biasing voltage and a Y line unselect voltage; and
   a second bias generating circuit electrically connected to a second body of each of a second plurality of Y line drivers, associated with the remaining plurality of Y lines, of the plurality of Y line drivers, wherein the second bias generating circuit is coupled to the Y line select biasing voltage and the Y line unselect voltage, wherein each of the first plurality of Y line drivers is electrically connected to a Y line select voltage, and wherein each of the second plurality of Y line drivers is electrically connected to a second Y line select voltage.

56. The nonvolatile memory array of claim 45, further comprising a drainage controller that controls the plurality of drainage X lines and a separate X-line decoder that controls the plurality of X-line drivers.

\* \* \* \* \*